(12) United States Patent
Kim et al.

(10) Patent No.: US 10,186,541 B2
(45) Date of Patent: Jan. 22, 2019

(54) SEMICONDUCTOR DEVICES

(71) Applicant: Samsung Electronics Co., Ltd., Suwon-si, Gyeonggi-do (KR)

(72) Inventors: Sun-Hyun Kim, Anyang-si (KR); Kyeongjae Byeon, Hwaseong-si (KR); Chungho Song, Uiwang-si (KR); Heegeun Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 15/224,095

(22) Filed: Jul. 29, 2016

(65) Prior Publication Data

US 2017/0040358 A1    Feb. 9, 2017

(30) Foreign Application Priority Data

Aug. 7, 2015  (KR) .................. 10-2015-0111840

(51) Int. Cl.
*H01L 27/146*  (2006.01)

(52) U.S. Cl.
CPC .... *H01L 27/1463* (2013.01); *H01L 27/14636* (2013.01); *H01L 27/14645* (2013.01); *H01L 27/14689* (2013.01)

(58) Field of Classification Search
CPC ........... H01L 27/1463; H01L 27/14636; H01L 27/14645; H01L 27/14689
See application file for complete search history.

(56) References Cited

U.S. PATENT DOCUMENTS

| 7,642,615 | B2 | 1/2010 | Chen et al. |
|---|---|---|---|
| 8,053,902 | B2 | 11/2011 | Chen et al. |
| 8,314,498 | B2 | 11/2012 | Hutto et al. |
| 8,779,344 | B2 | 7/2014 | Kao |
| 2007/0102740 | A1 | 5/2007 | Ellis-Monaghan et al. |
| 2011/0024867 | A1 | 2/2011 | Tseng et al. |
| 2011/0207258 | A1 | 8/2011 | Ahn et al. |
| 2012/0139127 | A1 | 6/2012 | Beyne |
| 2013/0032916 | A1 | 2/2013 | Lin et al. |
| 2014/0015083 | A1* | 1/2014 | Kao .................. H01L 27/14636 257/432 |
| 2014/0054743 | A1 | 2/2014 | Hurwitz et al. |
| 2014/0225215 | A1 | 8/2014 | Chien et al. |

FOREIGN PATENT DOCUMENTS

| KR | 1020010062445 A | 7/2001 |
|---|---|---|
| KR | 1020110013222 A | 2/2011 |
| KR | 1020110096275 A | 8/2011 |
| KR | 1020130016017 A | 2/2013 |
| KR | 1020140101273 A | 8/2014 |

* cited by examiner

*Primary Examiner* — Robert Bachner
(74) *Attorney, Agent, or Firm* — Ward and Smith, P.A.

(57) ABSTRACT

A semiconductor device includes a pad disposed on a semiconductor layer, an insulating layer disposed between the semiconductor layer and the pad, a through-via penetrating the semiconductor layer and the insulating layer so as to be connected to the pad, and an isolation layer penetrating the semiconductor layer and surrounding the pad when viewed from a plan view.

18 Claims, 30 Drawing Sheets

SEMICONDUCTOR DEVICES

CROSS-REFERENCE TO RELATED APPLICATION

This U.S. non-provisional patent application claims priority under 35 U.S.C. § 119 to Korean Patent Application No. 10-2015-0111840, filed on Aug. 7, 2015, in the Korean Intellectual Property Office, the disclosure of which is hereby incorporated by reference in its entirety.

BACKGROUND

The inventive concepts relate to semiconductor devices.

Semiconductor devices may include various kinds of semiconductor devices. For example, semiconductor devices may include semiconductor memory devices, semiconductor logic devices, and image sensors. The image sensors are semiconductor devices capable of converting an optical image into electrical signals. The image sensors may be categorized as any one of charge coupled device (CCD) type image sensors and complementary metal-oxide-semiconductor (CMOS) type image sensors.

As the semiconductor devices including the image sensors have been highly integrated, reliability of the semiconductor devices may be deteriorated.

SUMMARY

Embodiments of the inventive concepts may provide semiconductor devices capable of improving reliability.

In some embodiments, a semiconductor device may include a pad disposed on a semiconductor layer, an insulating layer disposed between the semiconductor layer and the pad, a through-via penetrating the semiconductor layer and the insulating layer so as to be connected to the pad, and an isolation layer penetrating the semiconductor layer. The isolation layer may surround the pad when viewed from a plan view.

In some embodiments, the isolation layer may include first isolation layers extending in a first direction and arranged in a second direction intersecting the first direction, and second isolation layers extending in the second direction to intersect the first isolation layers. The first isolation layers may be spaced apart from each other in the second direction, and the second isolation layers may be spaced apart from each other in the first direction. The isolation layer may have a grid structure when viewed from a plan view.

In some embodiments, the semiconductor layer may include unit regions defined by the isolation layer, and the unit regions may be arranged in a matrix form.

In some embodiments, the unit regions may include first unit regions and second unit regions. The through-via may be disposed in each of the first unit regions of the semiconductor layer but may not be disposed in the second unit regions of the semiconductor layer. The number of the first unit regions may be smaller than the number of the second unit regions.

In some embodiments, one or more through-vias may be disposed in one of the first unit regions.

In some embodiments, one through-via may be disposed in each of the first unit regions.

In some embodiments, the semiconductor device may further include an additional isolation layer penetrating the semiconductor layer and surrounding the through-via. The additional isolation layer may be disposed between the through-via and the isolation layer.

In some embodiments, the semiconductor layer may include a pixel area and a pad area around the pixel area. The pad may be provided in plurality on a first surface of the semiconductor layer of the pad area, and the plurality of pads may be arranged to surround the pixel area when viewed from a plan view.

In some embodiments, the semiconductor device may further include an interconnection structure disposed on a second surface, opposite to the first surface, of the semiconductor layer. The interconnection structure may include a metal interconnection, and the through-via may be in contact with the metal interconnection.

In some embodiments, the semiconductor layer may include a unit region defined by the isolation layer. The pad may include a first portion overlapping with the unit region of the semiconductor layer, and a second portion not overlapping with the unit region of the semiconductor layer. The second portion of the pad may surround the first portion of the pad when viewed from a plan view.

In some embodiments, the semiconductor layer may include a first portion on which the pad is disposed, and a second portion around the first portion. The first portion of the semiconductor layer may have an island shape separated from the second portion of the semiconductor layer by the isolation layer.

In another aspect, a semiconductor device may include a semiconductor layer including a pixel area and a pad area around the pixel area, a pixel isolation layer penetrating the semiconductor layer of the pixel area to define unit pixel regions, photoelectric conversion elements disposed in the unit pixel regions, through-vias penetrating the semiconductor layer of the pad area, pads disposed on the semiconductor layer of the pad area so as to be in contact with the through-vias, and a pad isolation layer penetrating the semiconductor layer of the pad area to surround each of the pads when viewed from a plan view.

Some embodiments of the present inventive concept include a semiconductor device that includes a pixel isolation layer that penetrates a pixel area of a semiconductor layer and that is between a plurality of unit pixel regions in the pixel area, a plurality of through-vias that penetrate a pad area of the semiconductor layer that is different from the pixel area; a plurality of pads that are in contact with ones of the plurality of through-vias; and a pad isolation layer that penetrates the semiconductor layer of the pad area and that surrounds ones of the plurality of pads when viewed from a plan view.

Some embodiments further include a plurality of photoelectric conversion elements that are in the unit pixel regions. In some embodiments, the pad area is around the pixel are and the plurality of pads are on a first surface of the semiconductor layer of the pad area and are arranged to surround the pixel area when viewed from a plan view. Some embodiments further include an interconnection structure that is on a second surface of the semiconductor layer that is opposite the first surface of the semiconductor layer and that comprises a metal interconnection that contacts ones of the plurality of through-vias.

In some embodiments, the pad isolation layer comprises first isolation layers that extend in a first direction and that are arranged in parallel with one another and second isolation layers that are extend in a second direction that is different from the first direction and that intersect the first isolation layers. Some embodiments further include an insulating layer that is between the semiconductor layer and the plurality of pads.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
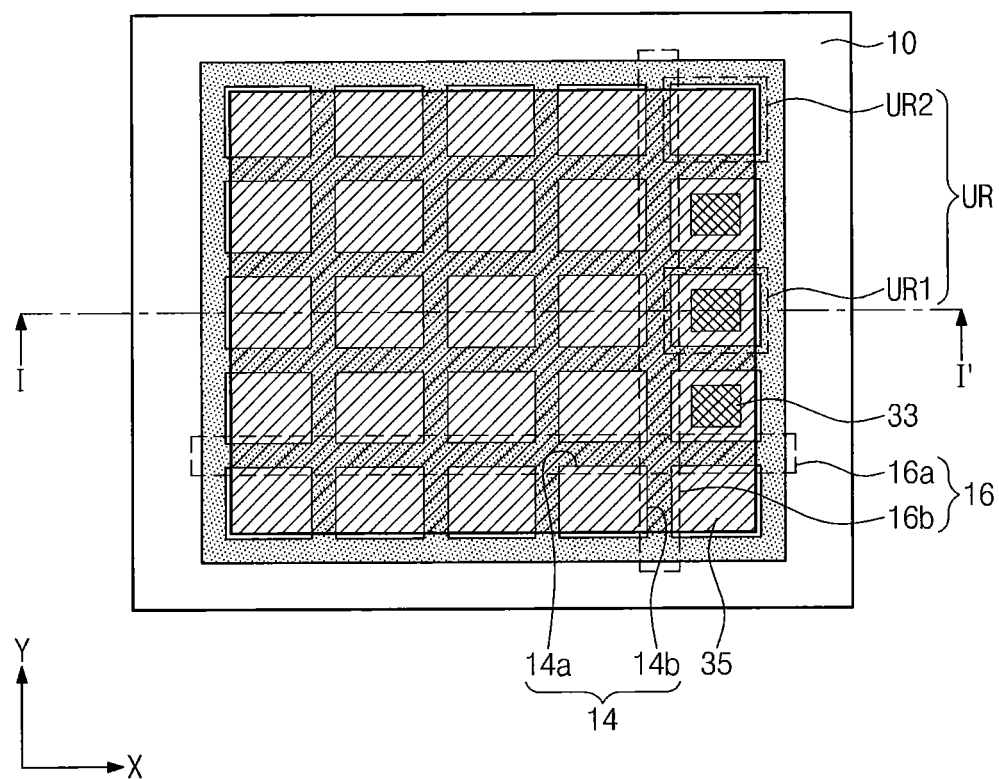
FIG. 1 is a plan view illustrating a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity. The same reference numerals or the same reference designators denote the same elements throughout the specification.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In addition, example embodiments are described herein with reference to cross-sectional views and/or plan views that are idealized example views. In the drawings, the thicknesses of layers and regions are exaggerated for clarity. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2:
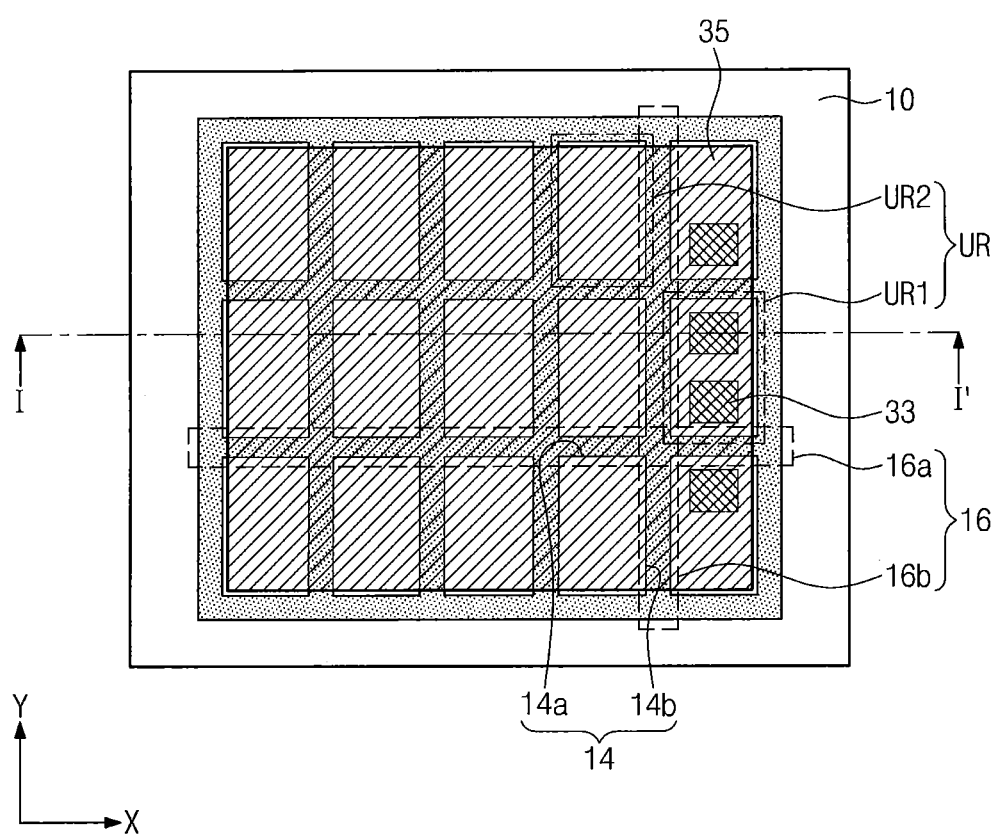
FIG. 2 is a plan view illustrating a semiconductor device according to some embodiments of the inventive concepts.
Figure 3:
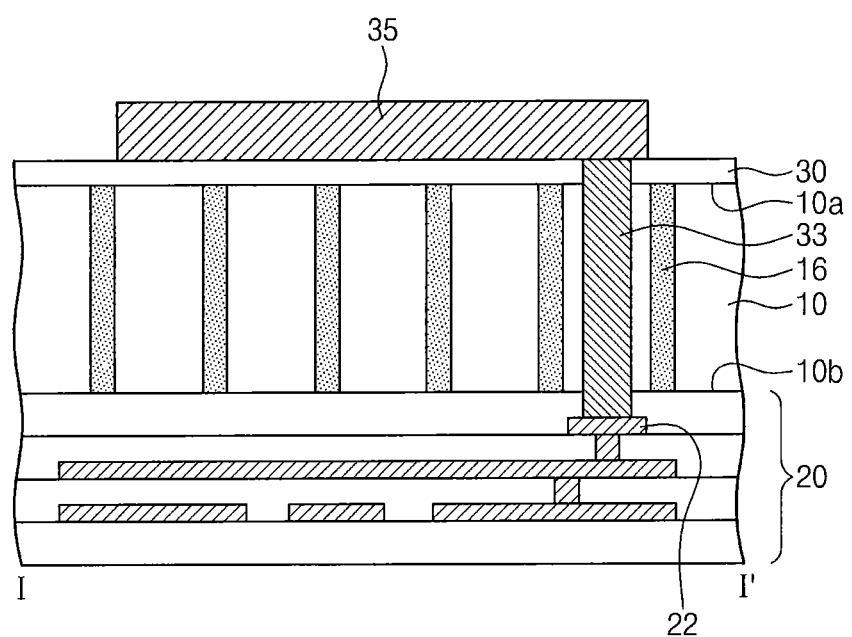
FIG. 3 is a cross-sectional view taken along a line I-I' of FIG. 1 or 2 to illustrate a semiconductor device according to some embodiments of the inventive concepts.

FIG. 1 is a plan view illustrating a semiconductor device according to some embodiments of the inventive concepts. FIG. 2 is a plan view illustrating a semiconductor device according to some embodiments of the inventive concepts. FIG. 3 is a cross-sectional view taken along a line I-I' of FIG. 1 or 2 to illustrate a semiconductor device according to some embodiments of the inventive concepts.

Referring to FIGS. 1 to 3, a semiconductor device may include a semiconductor layer 10, an isolation layer 16 penetrating the semiconductor layer 10, a through-via 33 penetrating the semiconductor layer 10, and a pad 35 disposed on the semiconductor layer 10. The pad 35 may be in contact with the through-via 33.

The semiconductor layer 10 may be a single-crystalline semiconductor substrate or an epitaxial layer formed by an epitaxial growth process. The semiconductor layer 10 may include a first surface 10a and a second surface 10b that are opposite to each other. The first surface 10a of the semiconductor layer 10 may correspond to a back surface of the semiconductor layer 10, and the second surface 10b of the semiconductor layer 10 may correspond to a front surface of the semiconductor layer 10.

The isolation layer 16 may be disposed in the semiconductor layer 10. The isolation layer 16 may penetrate the semiconductor layer 10. In some embodiments, as illustrated in FIG. 1 or 2, the isolation layer 16 may include first isolation layers 16a extending in a first direction X, and second isolation layers 16b extending in a second direction Y and intersecting the first isolation layers 16a. The first isolation layers 16a may cross the second isolation layers 16b. Thus, the isolation layer 16 may have a grid structure when viewed from a plan view. In some embodiments, the isolation layer 16 may have the grid structure having a polygonal shape or a circular shape. However, embodiments of the inventive concepts are not limited to the shape of the isolation layer 16. The isolation layer 16 may have at least one of other various shapes. The isolation layer 16 may include at least one of a silicon oxide layer, a silicon nitride layer, a silicon oxynitride layer, and/or a poly-silicon layer, among others.

The semiconductor layer 10 may include unit regions UR. The unit regions UR may be defined by the first isolation layers 16a and the second isolation layers 16b. The unit regions UR of the semiconductor layer 10 may be arranged in a matrix form when viewed from a plan view. The unit regions UR may include first unit regions UR1 in which the through-vias 33 are disposed, and second unit regions UR2 in which the through-via 33 is not disposed.

As describe above, the through-via 33 penetrating the semiconductor layer 10 may be provided. In some embodiments, as illustrated in FIG. 1, one through-via 33 may be disposed in each of the first unit regions UR1. In some embodiments, as illustrated in FIG. 2, one or more through-vias 33 may be disposed in one first unit region UR1. For example, a plurality of through-vias 33 may be disposed in one first unit region UR1. At this time, the plurality of through-vias 33 disposed in one first unit region UR1 may be spaced apart from each other. In some embodiments, the number of the first unit regions UR1 may be smaller than the number of the second unit regions UR2.

The through-via 33 may include a conductive material. For example, the through-via 33 may include at least one of copper (Cu), aluminum (Al), gold (Au), titanium (Ti), tantalum (Ta), and/or tungsten (W), among others.

An insulating layer 30 may be disposed on the first surface 10a of the semiconductor layer 10. The insulating layer 30 may cover an entire portion of the first surface 10a of the semiconductor layer 10. The insulating layer 30 may cover a top surface of the isolation layer 16, which is exposed at the first surface 10a of the semiconductor layer 10. The insulating layer 30 may electrically insulate the pad 35 from the semiconductor layer 10. The insulating layer 30 may include the same material as the isolation layer 16. In some embodiments, the insulating layer 30 may include a different material from the isolation layer 16. For example, the insulating layer 30 may include at least one of a silicon oxide layer, a silicon nitride layer, a silicon oxynitride layer, and/or a high-k dielectric layer (e.g., a hafnium oxide layer or an aluminum oxide layer), among others.

Figure 5:
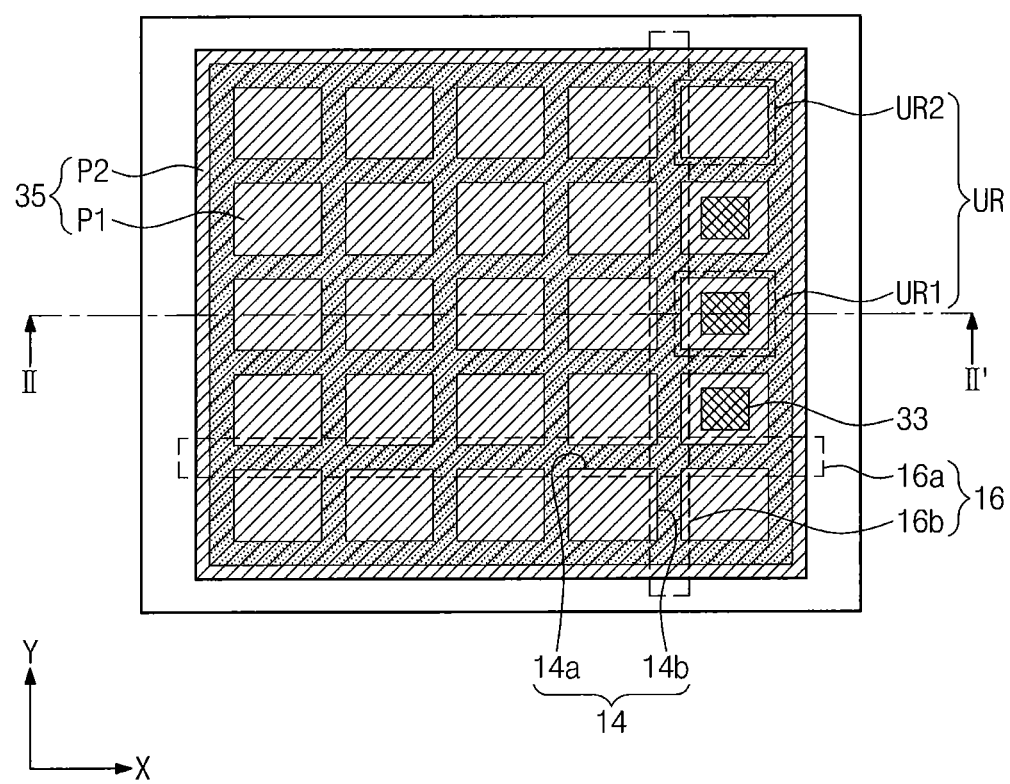
FIG. 5 is a plan view illustrating a semiconductor device according to some embodiments of the inventive concepts.
Figure 6:
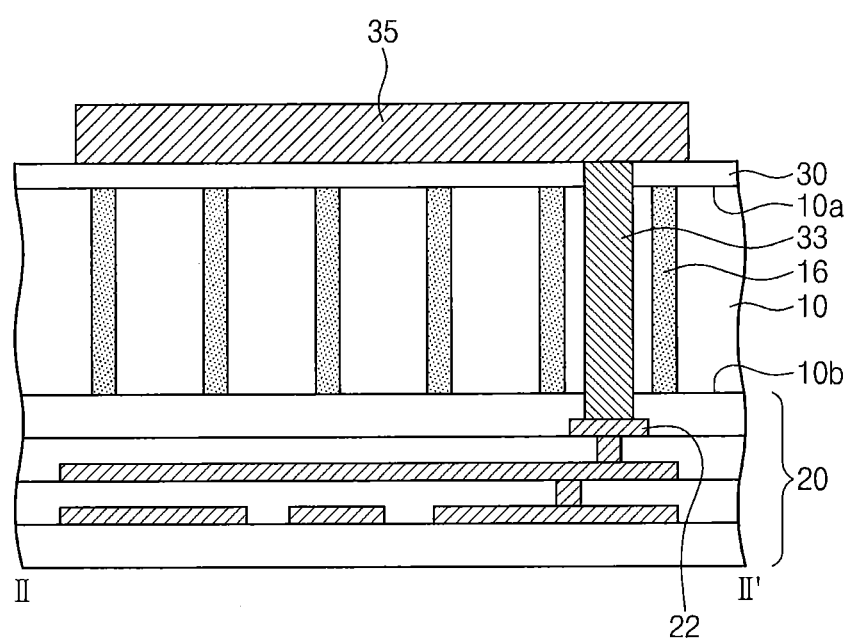
FIG. 6 is a cross-sectional view taken along a line II-II' of FIG. 5 to illustrate a semiconductor device according to some embodiments of the inventive concepts.

The pad 35 may be disposed on the insulating layer 30. The pad 35 may be in contact with the through-via 33 and may cover a portion of the insulating layer 30. In some embodiments, the pad 35 may be surrounded by the isolation layer 16 when viewed from a plan view. In some embodiments, as illustrated in FIGS. 5 and 6, the pad 35 may include a first portion P1 and a second portion P2. The first portion P1 of the pad 35 may overlap with the unit regions UR of the semiconductor layer 10. The second portion P2 of the pad 35 may not overlap with the unit regions UR of the semiconductor layer 10 and may surround the first portion P1. The pad 35 may include a conductive material. For example, the pad 35 may include at least one of copper (Cu), aluminum (Al), gold (Au), titanium (Ti), tantalum (Ta), and/or tungsten (W), among others.

An interconnection structure 20 may be disposed on the second surface 10b of the semiconductor layer 10. The interconnection structure 20 may include insulating layers and metal interconnections 22 which constitute a multi-layered structure. The metal interconnections 22 may be electrically connected to a semiconductor integrated circuit (not shown).

The through-via 33 may be connected to (e.g., in contact with) the metal interconnection 22 included in the interconnection structure 20. At this time, the through-via 33 may penetrate an upper portion of the interconnection structure 20 so as to be in contact with the metal interconnection 22. Thus, the pad 35 may be electrically connected to the metal interconnection 22 through the through-via 33.

Figure 4:
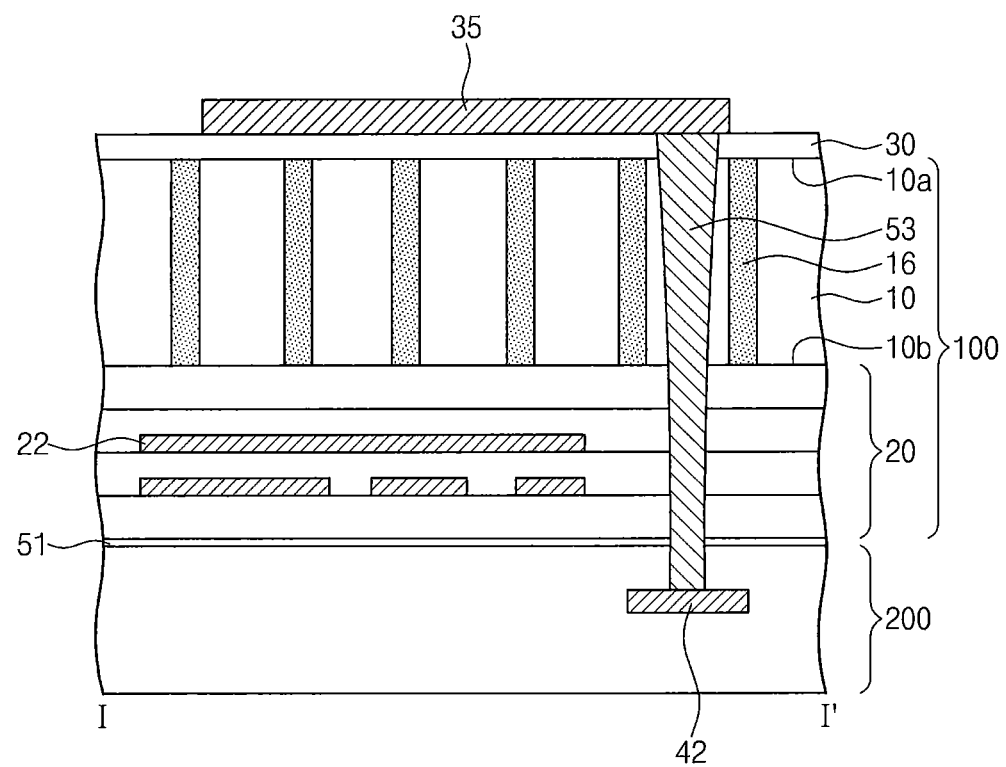
FIG. 4 is a cross-sectional view taken along the line I-I' of FIG. 1 or 2 to illustrate a semiconductor device according to some embodiments of the inventive concepts.

FIG. 4 is a cross-sectional view taken along the line I-I' of FIG. 1 or 2 to illustrate a semiconductor device according to some embodiments of the inventive concepts. In the embodiments illustrated in FIG. 4, the same elements as described in the embodiments of FIG. 3 will be indicated by the same reference numerals or the same reference designators, and the descriptions to the same elements as in the embodiments of FIG. 3 will be omitted or mentioned briefly for the purpose of ease and convenience in explanation.

Referring to FIGS. 1 and 4, a semiconductor device may include a first substrate 100, a second substrate 200 adhered to the first substrate 100, a through-via 53 penetrating the first substrate 100, and a pad 35 disposed on the first substrate 100 so as to be connected to the through-via 53.

The first substrate 100 may include a semiconductor layer 10 and an interconnection structure 20. In some embodiments, the first substrate 100 may include elements (e.g., transfer gates) of a pixel circuit or may include memory elements of a memory circuit. In some embodiments, the first substrate 100 may include the elements (e.g., transfer gates) of the pixel circuit and logic elements driving the elements of the pixel circuit. For example, the logic elements may include a vertical driving circuit, a column signal processing circuit, a horizontal driving circuit, and/or a system control circuit. In some embodiments, the first substrate 100 may include the memory elements of the memory circuit and memory logic elements driving the memory elements.

The second substrate 200 may be stacked on the first substrate 100. In detail, the second substrate 200 may be disposed on the interconnection structure 20 with an adhesive layer 51 interposed therebetween. In other word, the adhesive layer 51 may be disposed between an insulating layer of the first substrate 100 and the second substrate 200. In some embodiments, the second substrate 200 may include the logic elements (e.g., the vertical driving circuit, the column signal processing circuit, the horizontal driving circuit, and/or the system control circuit) for driving the elements of the pixel circuit. In some embodiments, the second substrate 200 may include the memory logic elements for driving the memory elements. In some embodiments, the second substrate 200 may be a dummy substrate.

The second substrate 200 may include a metal interconnection 42. In some embodiments, the metal interconnection 42 may be electrically connected to a semiconductor integrated circuit included in the second substrate 20. The metal interconnection 42 may be in contact with the through-via 53. Thus, the metal interconnection 42 may be electrically connected to the pad 35 through the through-via 53.

Figure 7:
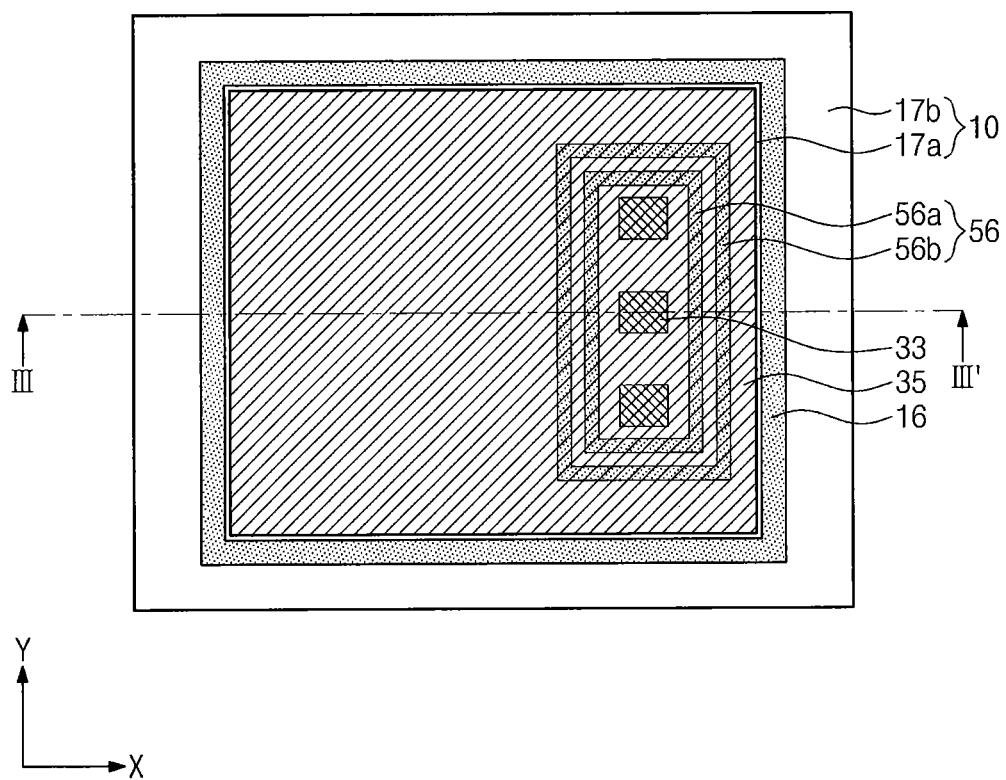
FIG. 7 is a plan view illustrating a semiconductor device according to some embodiments of the inventive concepts.
Figure 8:
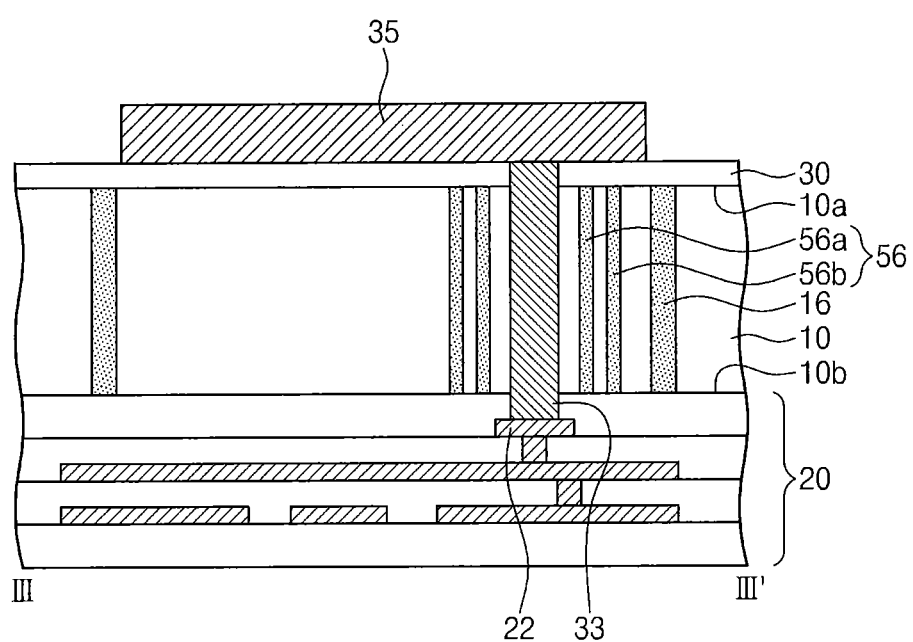
FIG. 8 is a cross-sectional view taken along a line III-III' of FIG. 7 to illustrate a semiconductor device according to some embodiments of the inventive concepts.

FIG. 7 is a plan view illustrating a semiconductor device according to some embodiments of the inventive concepts. FIG. 8 is a cross-sectional view taken along a line III-III' of FIG. 7 to illustrate a semiconductor device according to some embodiments of the inventive concepts. In the embodiments illustrated in FIGS. 7 and 8, the same elements as described in the embodiments of FIG. 3 will be indicated by the same reference numerals or the same reference designators, and the descriptions to the same elements as in the embodiments of FIG. 3 will be omitted or mentioned briefly for the purpose of ease and convenience in explanation.

Referring to FIGS. 7 and 8, an isolation layer 16 illustrated in FIGS. 7 and 8 may have a different structure from the isolation layer 16 illustrated in FIGS. 1 to 3. The isolation layer 16 according to the present embodiments may have a loop shape surrounding the pad 35 when viewed from a plan view. In this case, the semiconductor layer 10 may include a first portion 17a and a second portion 17b. The pad 35 may be disposed on the first portion 17a of the semiconductor layer 10, and the second portion 17b of the semiconductor layer 10 may be disposed around the first portion 17a. The first portion 17a of the semiconductor layer 10 may be separated from the second portion 17b of the semiconductor layer 10 by the isolation layer 16. Thus, the first portion 17a may have an island shape. A via isolation layer 56 may penetrate the semiconductor layer 10 and may surround the through-via 33. The via isolation layer 56 may include a first via isolation layer 56a and a second via isolation layer 56b. The first via isolation layer 56a may surround the through-via 33, and the second via isolation layer 56b may surround the first via isolation layer 56a. The second via isolation layer 56b may be disposed between the first via isolation layer 56a and the isolation layer 16. The via isolation layer 56 may include the same material as the isolation layer 16 or may include a different material from the isolation layer 16.

FIGS. 9A to 9D are cross-sectional views taken along the line I-I' of FIG. 1 or 2 to illustrate some embodiments of methods of manufacturing the semiconductor device illustrated in FIG. 3.

Figure 9A:
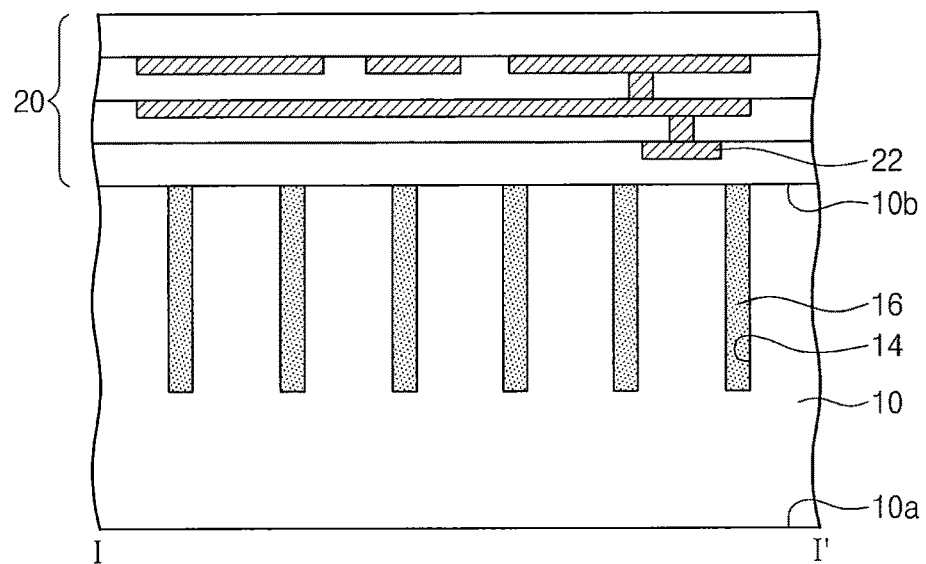
FIGS. 9A to 9D are cross-sectional views taken along the line I-I' of FIG. 1 or 2 to illustrate some embodiments of methods of manufacturing the semiconductor device illustrated in FIG. 3.

Referring to FIGS. 1 and 9A, a semiconductor layer 10 may be provided. The semiconductor layer 10 may be a portion of a single-crystalline semiconductor substrate or may be an epitaxial layer formed by an epitaxial growth process. The semiconductor layer 10 may include a first surface 10a and a second surface 10b that are opposite to each other. The first surface 10a of the semiconductor layer 10 may correspond to a back surface of the semiconductor layer 10, and the second surface 10b of the semiconductor layer 10 may correspond to a front surface of the semiconductor layer 10.

A portion of the semiconductor layer 10 may be etched from the second surface 10b to form an isolation trench 14 in the semiconductor layer 10. The isolation trench 14 may have a grid structure when viewed from a plan view. As illustrated in FIG. 1 or 2, the isolation trench 14 may include first trenches 14a extending in the first direction X and second trenches 14b extending in the second direction Y to intersect the first trenches 14a.

An isolation layer 16 may be formed in the isolation trench 14. In detail, a filling material may be formed to cover the second surface 10b and to fill the isolation trench 14, and an etching process may be performed on the filling material to confinedly form the isolation layer 16 in the isolation trench 14. For example, the isolation layer 16 may include at least one of a silicon oxide layer, a silicon nitride layer, a silicon oxynitride layer, and/or a poly-silicon layer, among others. The first isolation layer 16 may include first isolation layers 16a filling the first trenches 14a and second isolation layers 16b filling the second trenches 14b. The isolation layer 16 may have a grid structure when viewed from a plan view.

An interconnection structure 20 may be formed on the second surface 10b of the semiconductor layer 10. The interconnection structure 20 may include a plurality of insulating layers and a plurality of metal interconnections 22.

Figure 9B:
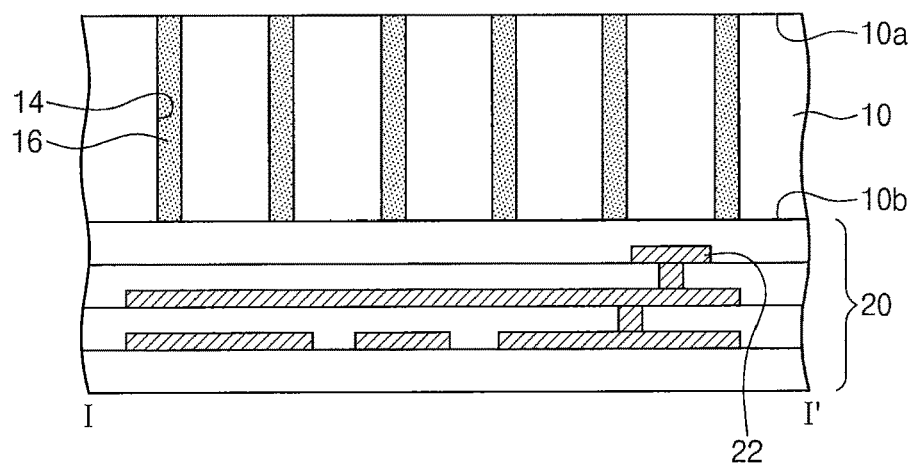

Referring to FIGS. 1 and 9B, the first surface 10a of the semiconductor layer 10 may be etched until the isolation layer 16 is exposed. For example, the semiconductor layer 10 after the etching process may have a thickness of several μm to several tens μm. The etching process may be a chemical mechanical polishing (CMP) process and/or an etch-back process.

Figure 9C:
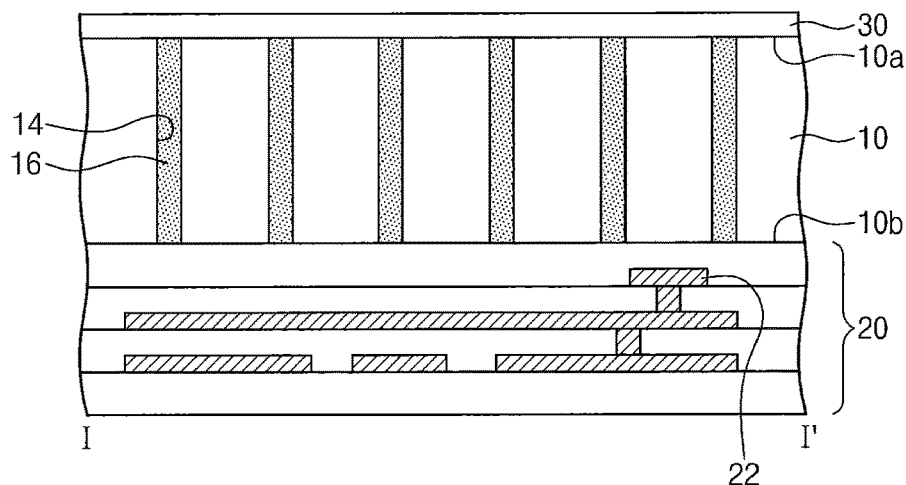

Referring to FIG. 9C, an insulating layer 30 may be formed on the first surface 10a of the semiconductor layer 10. The insulating layer 30 may cover an entire portion of the first surface 10a of the semiconductor layer 10. The insulating layer 30 may cover a top surface of the isolation layer 16. The insulating layer 30 may include the same material as the isolation layer 16 or may include a different material from the isolation layer 16. For example, the insulating layer 30 may include at least one of a silicon oxide layer, a silicon nitride layer, a silicon oxynitride layer, and/or a high-k dielectric layer (e.g., a hafnium oxide layer or an aluminum oxide layer), among others.

Figure 9D:
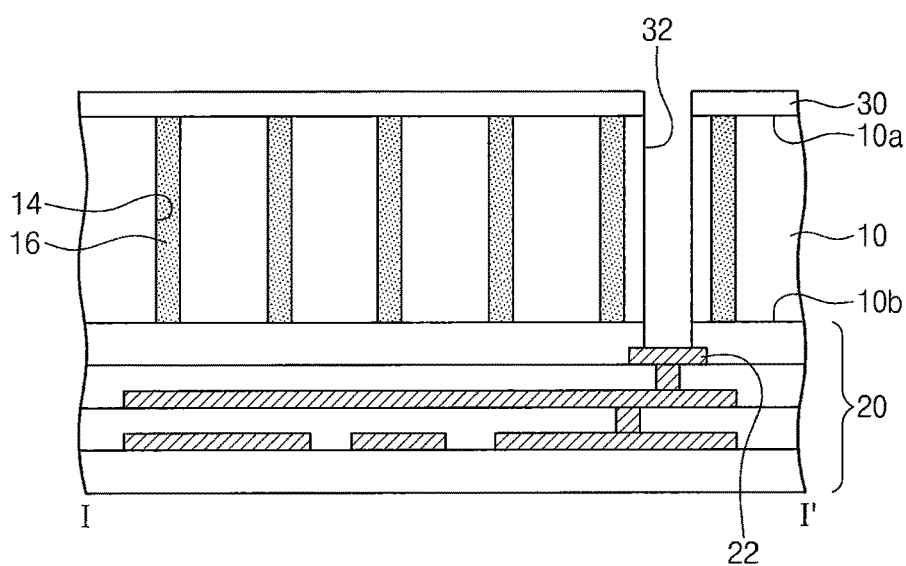

Referring to FIG. 9D, a via-hole 32 may be formed in the semiconductor layer 10. In some embodiments, a mask pattern (not shown) may be formed on the insulating layer 30. The mask pattern (not shown) may have an opening exposing a portion of the insulating layer 30. The insulating layer 30 and the semiconductor layer 10 may be sequentially etched using the mask pattern as an etch mask to form the via-hole 32. In addition, a portion of the insulating layer included in the interconnection structure 20 may be further etched to expose the metal interconnection 22. Thus, the metal interconnection 22 may be exposed through the via-hole 32.

Referring again to FIG. 3, a through-via 33 may be formed in the via-hole 32. The through-via 33 may be formed by filling the via-hole 32 with a conductive material. A pad 35 may be formed on the insulating layer 30. In some embodiments, a conductive layer may be formed on the through-via 33 and a top surface of the insulating layer 30, and a patterning process may be performed on the conductive layer to form the pad 35.

In some embodiments, the pad 35 and the through-via 33 may be formed at the same time. In detail, a conductive layer may be formed on the insulating layer 30 to fill the via-hole 32 and to cover the top surface of the insulating layer 30, and a patterning process may be performed on the conductive layer. Thus, the through-via 33 may be formed in the via-hole 32 and the pad 35 may be formed on the insulating layer 30. The through-via 33 and a pad 35 may include a conductive material. The pad 35 and the through-via 33 may include the same conductive material or different conductive materials from each other. For example, each of the through-via 33 and the pad 35 may include at least one of copper (Cu), aluminum (Al), gold (Au), titanium (Ti), tantalum (Ta), and/or tungsten (W), among others.

FIGS. 10A to 10E are cross-sectional views taken along the line I-I' of FIG. 1 or 2 to illustrate some embodiments of methods of manufacturing the semiconductor device illustrated in FIG. 3. In the present embodiments, the same elements as described in the embodiments of FIGS. 9A to 9D will be indicated by the same reference numerals or the same reference designators, and the descriptions to the same elements as in the embodiments of FIGS. 9A to 9D will be omitted or mentioned briefly for the purpose of ease and convenience in explanation.

Figure 10A:
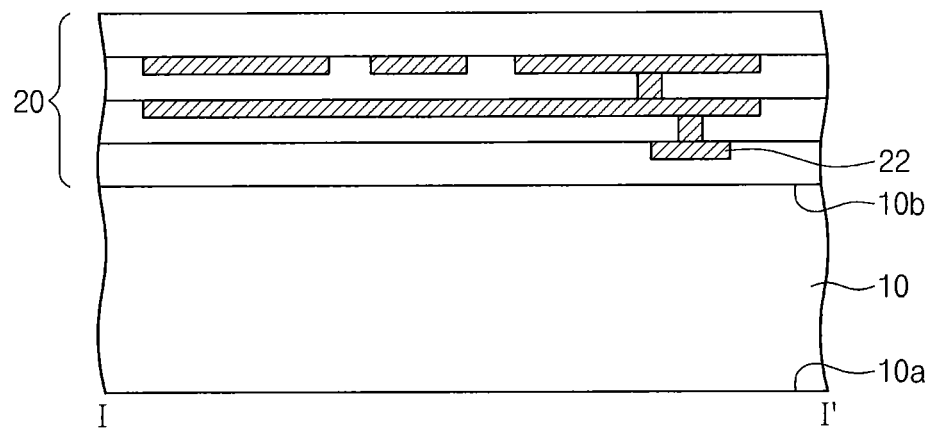
FIGS. 10A to 10E are cross-sectional views taken along the line I-I' of FIG. 1 or 2 to illustrate some embodiments of methods of manufacturing the semiconductor device illustrated in FIG. 3.

Referring to FIG. 10A, the semiconductor layer 10 may be provided. The interconnection structure 20 may be formed on the second surface 10b of the semiconductor layer 10. The interconnection structure 20 may include a plurality of insulating layers and a plurality of metal interconnections 22.

Figure 10B:
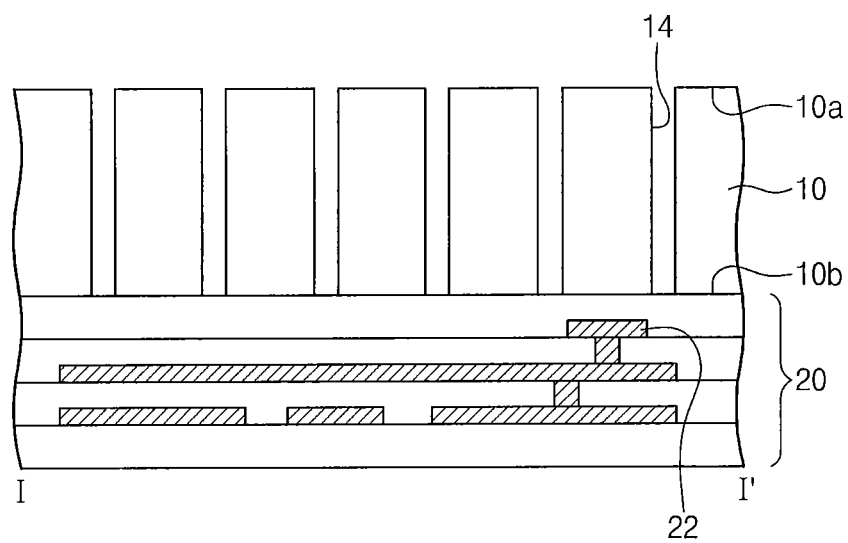

Referring to FIG. 10B, a portion of the semiconductor layer 10 may be etched from the first surface 10a of the semiconductor layer 10 to form an isolation trench 14 in the semiconductor layer 10. The portions of the semiconductor layer 10 may be etched until the insulating layer of the interconnection structure 20 is exposed, thereby forming the isolation trench 14. In some embodiments, the isolation trench 14 may include the first trenches 14a and the second trenches 14b, as illustrated in FIG. 1. The isolation trench 14 may have a grid structure when viewed from a plan view.

Figure 10C:
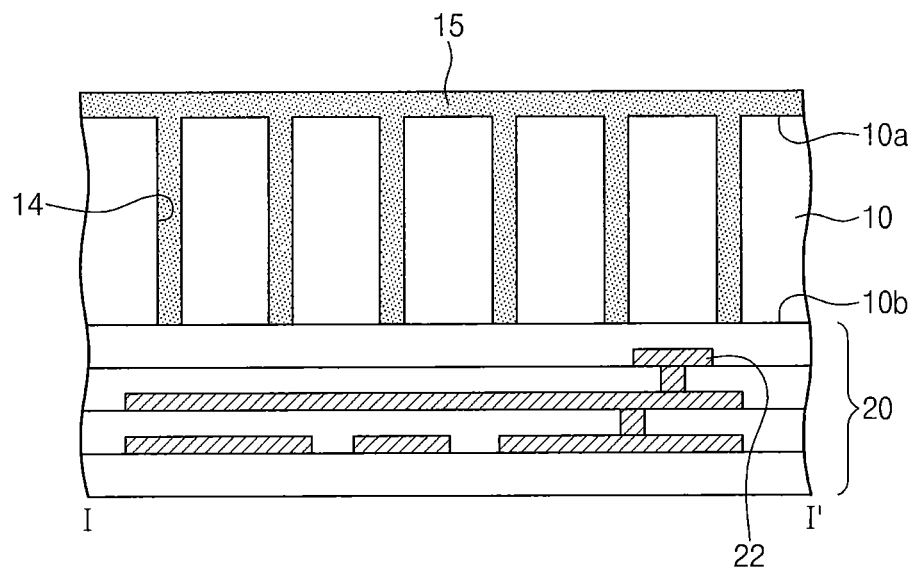

Referring to FIG. 10C, a trench insulating layer 15 may be formed on the first surface 10a of the semiconductor layer 10. The trench insulating layer 15 may fill the isolation trench 14 and may cover the first surface 10a of the semiconductor layer 10. In some embodiments, forming the trench insulating layer 15 may include forming a liner insulating layer conformally covering an inner surface of the isolation trench 14 on the first surface 10a of the semiconductor layer 10, and forming a gap-fill layer filling the isolation trench 14 on the liner insulating layer.

Figure 10D:
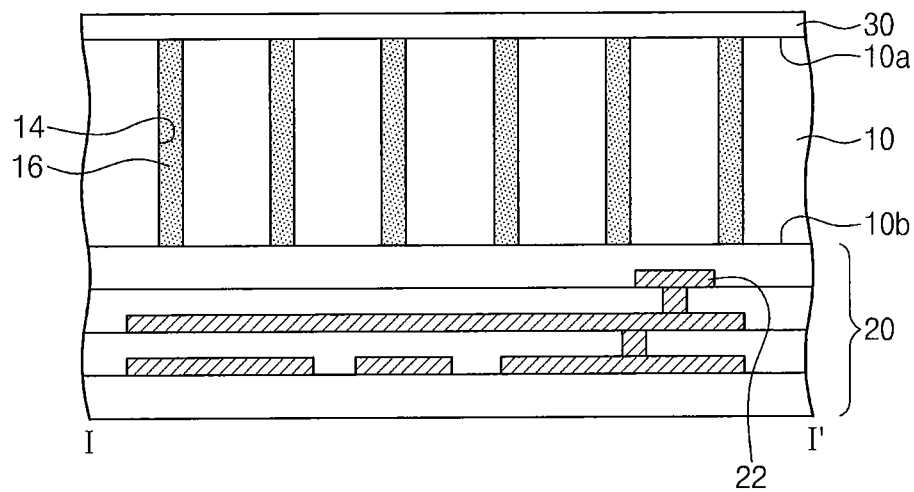

Referring to FIG. 10D, the trench insulating layer 15 may be etched to confinedly form an isolation layer 16 in the isolation trench 16. The trench insulating layer 15 may be etched by a CMP process and/or an etch-back process.

An insulating layer 30 may be formed on the first surface 10a of the semiconductor layer 10 having the isolation layer 16. The insulating layer 30 may cover an entire portion of the first surface 10a of the semiconductor layer. The insulating layer 30 may cover a top surface of the isolation layer 16.

Figure 10E:
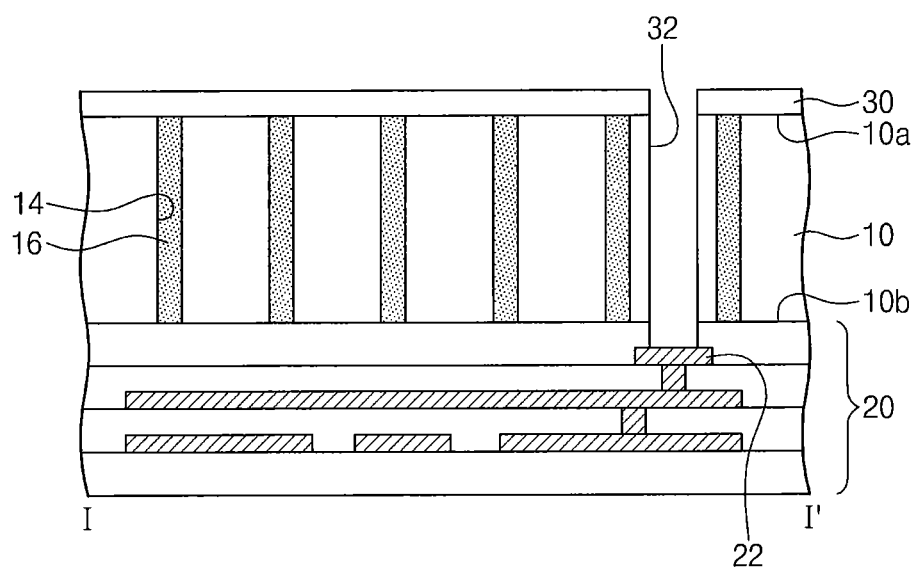

Referring to FIG. 10E, a via-hole 32 may be formed in the semiconductor layer 10. At least one of the metal interconnections 22 may be exposed through the via-hole 32.

Referring again to FIG. 3, the through-via 33 may be formed in the via-hole 32, and the pad 35 being in contact with the through-via 33 may be formed on the insulating layer 30.

FIGS. 11A to 11D are cross-sectional views taken along the line I-I' of FIG. 1 or 2 to illustrate some embodiments of methods of manufacturing the semiconductor device illustrated in FIG. 4. In the present embodiments, the same elements as described in the embodiments of FIGS. 9A to 9D will be indicated by the same reference numerals or the same reference designators, and the descriptions to the same elements as in the embodiments of FIGS. 9A to 9D will be omitted or mentioned briefly for the purpose of ease and convenience in explanation.

Figure 11A:
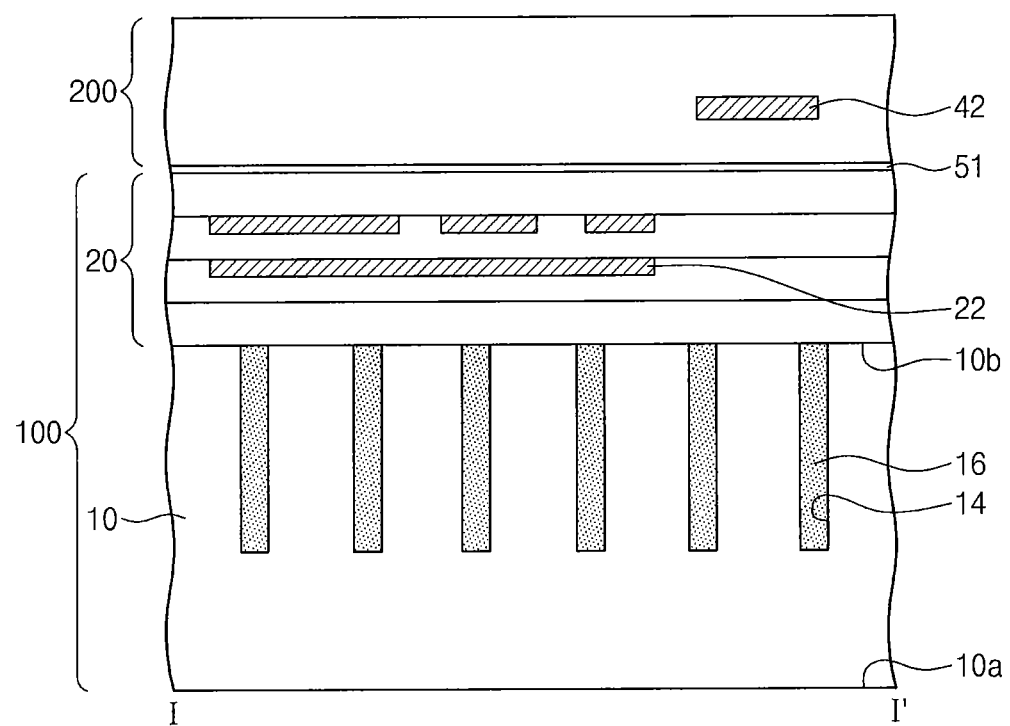
FIGS. 11A to 11D are cross-sectional views taken along the line I-I' of FIG. 1 or 2 to illustrate some embodiments of methods of manufacturing the semiconductor device illustrated in FIG. 4.

Referring to FIG. 11A, a first substrate 100 may be prepared. The first substrate 100 may include a semiconductor layer 10 and an interconnection structure 20. In some embodiments, the first substrate 100 may include elements (e.g., transfer gates) of a pixel circuit or may include memory elements of a memory circuit. In some embodiments, the first substrate 100 may include the elements of the pixel circuit and logic elements (e.g., a vertical driving circuit, a column signal processing circuit, a horizontal driving circuit, and/or a system control circuit) for driving the elements of the pixel circuit. In some embodiments, the first substrate 100 may include the memory elements of the memory circuit and memory logic elements driving the memory elements.

An etching process may be selectively performed on the second surface 10b of the semiconductor layer 10 to form an isolation trench 14 in the semiconductor layer 10. The isolation trench 14 may have a grid structure when viewed from a plan view. An isolation layer 16 may be formed in the isolation trench 14. The isolation layer 16 may be formed by filling the isolation trench 14 with one or more layers. The isolation layer 16 may include the first isolation layers 16a and the second isolation layers 16b illustrated in FIG. 1 or 2. The isolation layer 16 may have a grid structure when viewed from a plan view.

The interconnection structure 20 may be formed on the second surface 10b of the semiconductor layer 10. The interconnection structure 20 may be formed by stacking a plurality of insulating layers and a plurality of metal interconnections 22.

A second substrate 200 may be adhered to the insulating layer of the first substrate 100. The second substrate 200 may be adhered to the interconnection structure 20 by an adhesive layer 51. In some embodiments, the second substrate 200 may include the logic elements for driving the elements of the pixel circuit. In some embodiments, the second substrate 200 may include the memory logic elements for driving the memory elements. In some embodiments, the second substrate 200 may be a dummy substrate. The second substrate 200 may include a metal interconnection 42. In some embodiments, the metal interconnection 42 may be electrically connected to a semiconductor integrated circuit included in the second substrate 200.

Figure 11B:
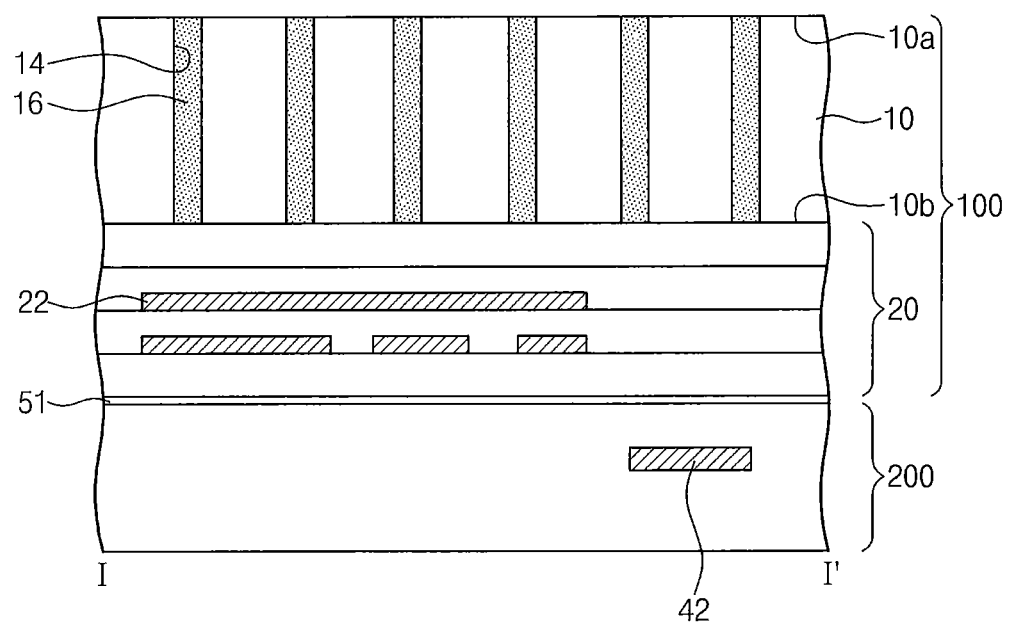

Referring to FIG. 11B, the first surface 10a of the semiconductor layer 10 may be etched until the isolation layer 16 is exposed.

Figure 11C:
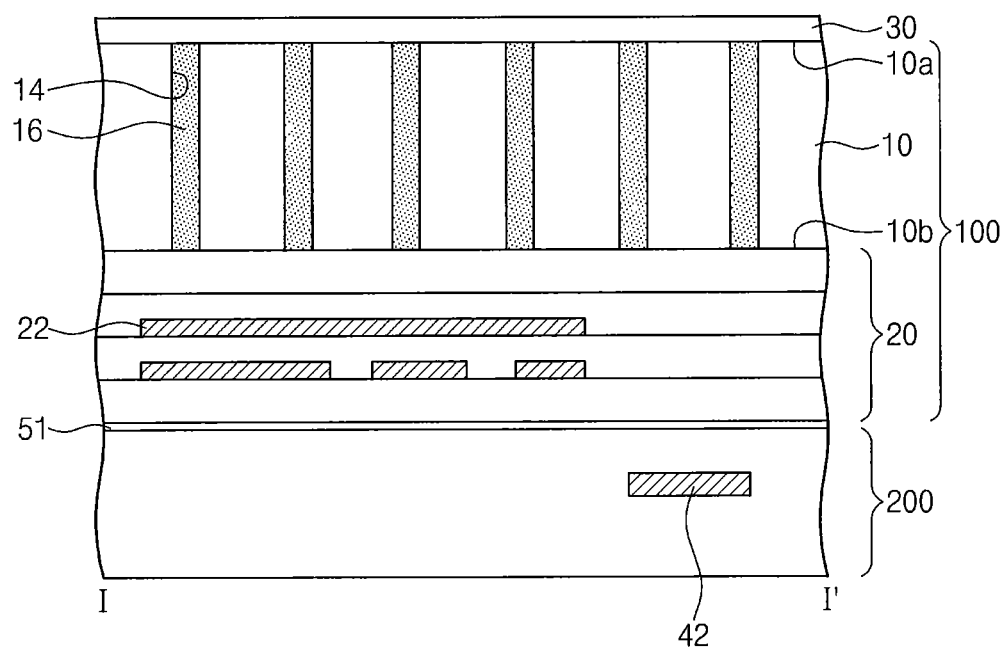

Referring to FIG. 11C, an insulating layer 30 may be formed on the first surface 10a of the semiconductor layer 10. The insulating layer 30 may cover an entire portion of the first surface 10a of the semiconductor layer 10.

Figure 11D:
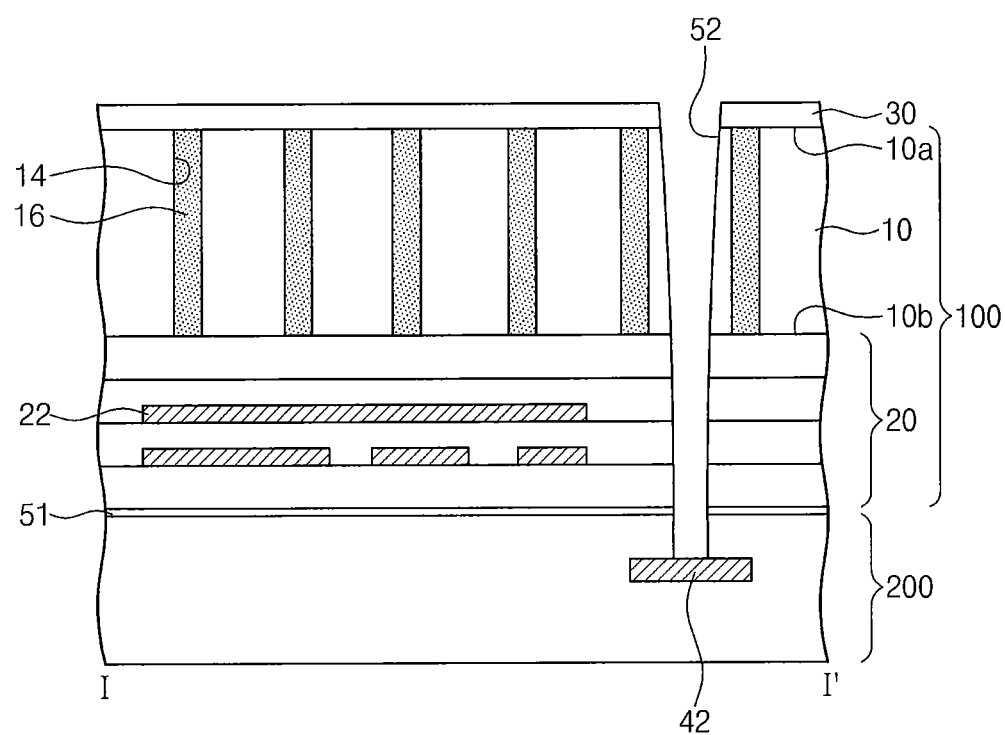

Referring to FIG. 11D, a via-hole 52 may be formed in the first substrate 100. In some embodiments, a mask pattern (not shown) having an opening exposing a portion of the insulating layer 30 may be formed on the insulating layer 30. The insulating layer 30, the semiconductor layer 10, the interconnection structure 20, and the adhesive layer 51 may be sequentially etched using the mask pattern as an etch mask to form the via-hole 52. A portion of the second substrate 200 may be further etched to expose the metal interconnection 42. Thus, the metal interconnection 42 may be exposed through the via-hole 52.

Referring again to FIG. 4, the through-via 53 may be formed in the via-hole 52. The through-via 53 may be formed by filling the via-hole 52 with a conductive material.

The pad 35 being in contact with the through-via 53 may be formed on the insulating layer 30.

Figure 12:
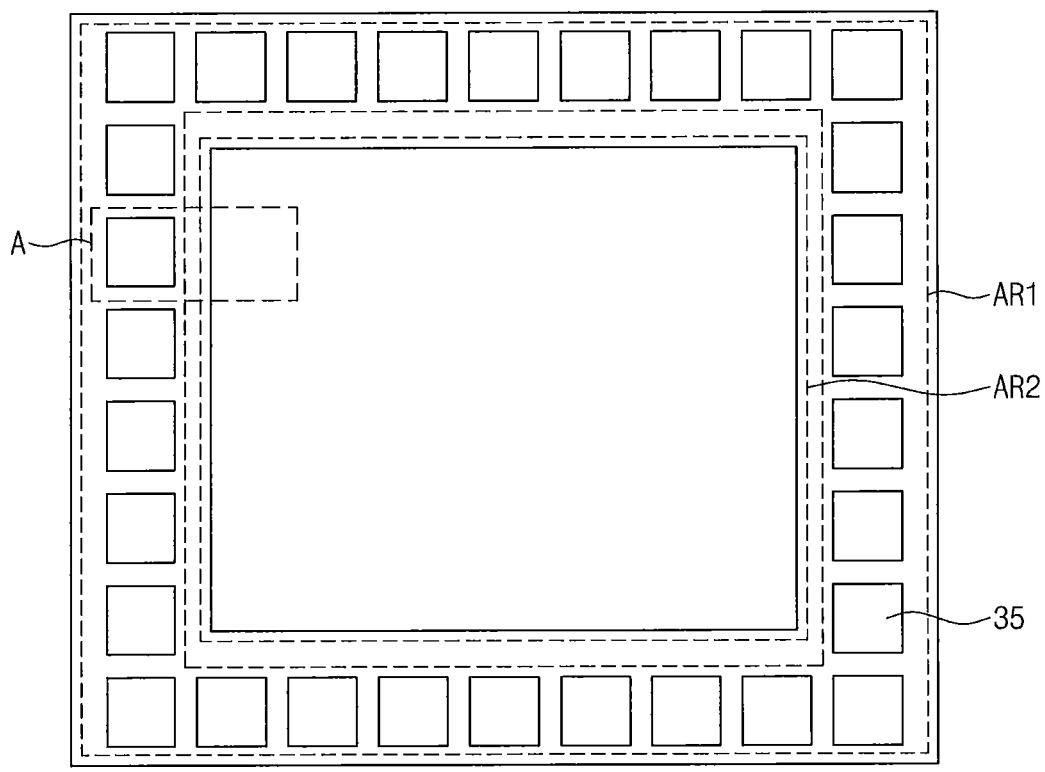
FIG. 12 is a schematic plan view illustrating a semiconductor device according to some embodiments of the inventive concepts.
Figure 13:
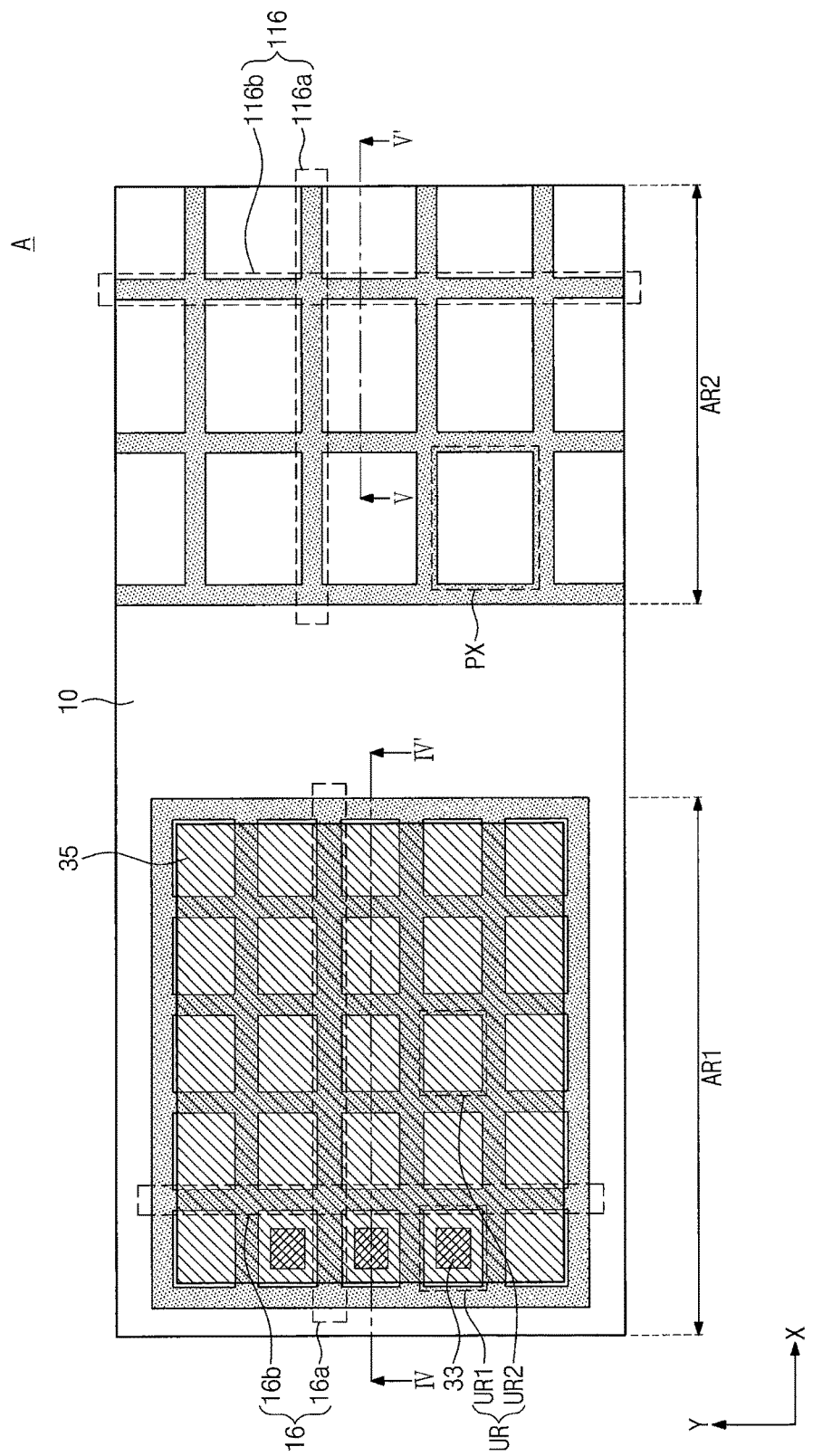
FIG. 13 is an enlarged view of a portion 'A' of FIG. 12.
Figure 14:
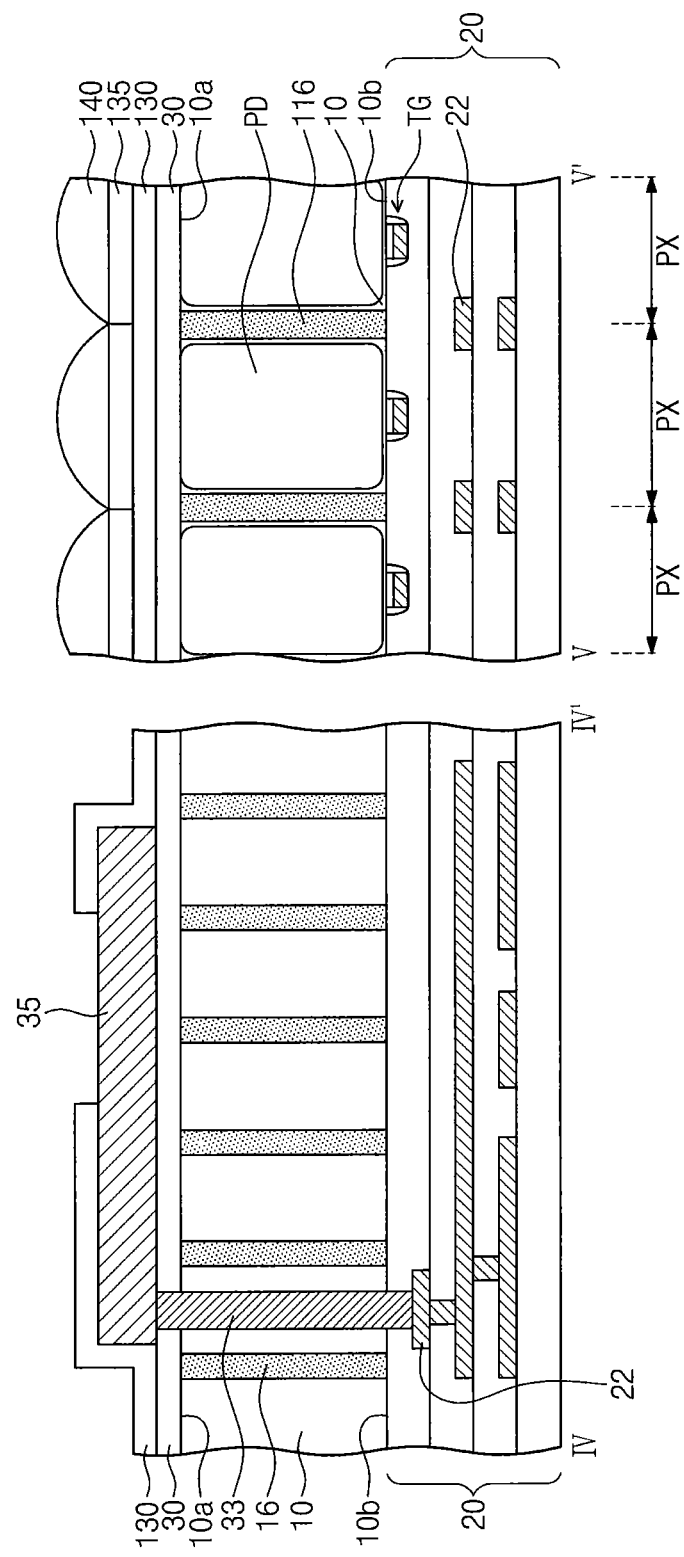
FIG. 14 is a cross-sectional view taken along lines IV-IV' and V-V' of FIG. 13 to illustrate a semiconductor device according to some embodiments of the inventive concepts.

FIG. 12 is a schematic plan view illustrating a semiconductor device according to some embodiments of the inventive concepts. FIG. 13 is an enlarged view of a portion 'A' of FIG. 12. FIG. 14 is a cross-sectional view taken along lines IV-IV' and V-V' of FIG. 13 to illustrate a semiconductor device according to some embodiments of the inventive concepts.

Referring to FIGS. 12 to 14, a semiconductor device 1000 according to the present embodiments may be an image sensor 1000. The image sensor 1000 may include a semiconductor layer 10 including a pixel area AR2 and a pad area AR1 disposed around the pixel area AR2. Pads 35 and through-vias 33 being in contact with the pads 35 may be disposed in the pad area AR1 of the image sensor 1000. The pads 35 may be arranged along an edge of the pixel area AR2 of the semiconductor layer 10. The pads 35 may be electrically insulated from each other. The pads 35 may have potentials different from each other. The pixel area AR2 of the semiconductor layer 10 may be an active pixel array region. The pixel area AR2 of the semiconductor layer 10 may include unit pixels.

Referring to FIGS. 13 and 14, the semiconductor layer 10 may be provided. The semiconductor layer 10 may be a single-crystalline semiconductor substrate or may be an epitaxial layer formed by an epitaxial growth process. The semiconductor layer 10 may include a first surface 10a and a second surface 10b that are opposite to each other. The first surface 10a of the semiconductor layer 10 may correspond to a back surface of the semiconductor layer 10, and the second surface 10b of the semiconductor layer 10 may correspond to a front surface of the semiconductor layer 10. The first surface 10a of the semiconductor layer 10 may be a surface on which light is incident.

An isolation layer 16 penetrating the semiconductor layer 10 may be disposed in the pad area AR1. The isolation layer 16 may be provided in plurality in the pad area AR1, and the plurality of isolation layers 16 may correspond to the pads 35, respectively. FIG. 13 illustrates the pad area AR1 corresponding to one pad 35. In some embodiments, the isolation layer 16 corresponding to one pad 35 may include first isolation layers 16a extending a first direction X and second isolation layers 16b extending in a second direction Y to intersect the first isolation layers 16a. The first isolation layers 16a may cross the second isolation layers 16b, so the isolation layer 16 may have a grid structure when viewed from a plan view. In some embodiments, the isolation layer 16 may have the grid structure having a polygonal shape or a circular shape. However, embodiments of the inventive concepts are not limited to the shape of the isolation layer 16. The isolation layer 16 may have at least one of other various shapes. The isolation layer 16 may include one or more layers. For example, the isolation layer 16 may include at least one of a silicon oxide layer, a silicon nitride layer, a silicon oxynitride layer, and/or a poly-silicon layer, among layers.

In the pad area AR1, the semiconductor layer 10 may include unit regions UR. The unit regions UR may be defined by the isolation layer 16. The unit regions UR of the semiconductor layer 10 in the pad area AR1 may be arranged in a matrix form when viewed from a plan view. The unit regions UR may include first unit regions UR1 in which the through-vias 33 are disposed, and second unit regions UR2 in which the through-via 33 is not disposed.

The through-via 33 may be provided in the semiconductor layer 10 of the pad area AR1. The through-via 33 may penetrate the semiconductor layer 10 of the pad area AR1. The through-via 33 may be provided in plurality. In some embodiments, the through-vias 33 may be disposed in the first unit regions UR1, respectively. In some embodiments, one or more through-vias 33 may be disposed in one first unit region UR1. For example, a plurality of through-vias 33 may be disposed in one first unit region UR1. At this time, the plurality of through-vias 33 disposed in one first unit region UR1 may be spaced apart from each other. In some embodiments, the number of the first unit regions UR1 may be smaller than the number of the second unit regions UR2.

The through-via 33 may include a conductive material. For example, the through-via 33 may include at least one of copper (Cu), aluminum (Al), gold (Au), titanium (Ti), tantalum (Ta), or tungsten (W).

A pixel isolation layer 116 penetrating the semiconductor layer 10 may be disposed in the pixel area AR2. The pixel isolation layer 116 may include first pixel isolation layers 116a extending the first direction X and second pixel isolation layers 116b extending in the second direction Y to intersect the first pixel isolation layers 116a. The first pixel isolation layers 116a may cross the second pixel isolation layers 116b. The pixel isolation layer 116 may have a grid structure when viewed from a plan view. In some embodiments, the pixel isolation layer 116 may have the same structure as the isolation layer 16 when viewed from a plan view.

The pixel isolation layer 116 may include the same material as the isolation layer 16. For example, the pixel isolation layer 116 may include at least one of a silicon oxide layer, a silicon nitride layer, a silicon oxynitride layer, and/or a poly-silicon layer, among others.

The pixel isolation layer 116 may define a plurality of unit pixel regions PX in the pixel area AR2 of the semiconductor layer 10. The unit pixel regions PX may be arranged in a matrix form when viewed from a plan view.

A photoelectric conversion element PD may be disposed in the semiconductor layer 10 of each of the unit pixel regions PX. For example, the photoelectric conversion element PD may be doped with N-type dopants. Even though not shown in the drawings, a floating diffusion region (not shown) may be disposed in the semiconductor layer 10 of each of the unit pixel regions PX. The floating diffusion region may be doped with N-type dopants.

In the unit pixel region PX, a transfer gate TG may be disposed on the second surface 10b of the semiconductor layer 10. The transfer gate TG may be disposed on the second surface 10b between the photoelectric conversion element PD and the floating diffusion region. The transfer gate TG may transfer charges accumulated in the photoelectric conversion element PD into the floating diffusion region. The transfer gate TG may be one of elements of a pixel circuit.

An interconnection structure 20 may be disposed on the second surface 10b of the semiconductor layer 10. The interconnection structure 20 may include insulating layers and metal interconnections 22 which constitute a multi-layered structure. One of the insulating layers of the interconnection structure 20 may cover the transfer gate TG. In some embodiments, some of the metal interconnections 22 may be disposed in the interconnection structure 20 of the pad area AR1. At least one of the metal interconnections 22 may be in contact with the through-via 33. At this time, the through-via 33 may penetrate an upper portion of the interconnection structure 20 so as to be in contact with the metal interconnection 22.

An insulating layer 30 may be disposed on the first surface 10a of the semiconductor layer 10. The insulating layer 30 may cover an entire portion of the first surface 10a of the semiconductor layer 10. Thus, the insulating layer 30 may cover a top surface of the isolation layer 16 and a top surface of the pixel isolation layer 116, which are exposed at the first surface 10a of the semiconductor layer 10. The insulating layer 30 disposed on the semiconductor layer 10 in the pad area AR1 may electrically insulate the pad 35 from the semiconductor layer 10 of the pad area AR1. On the contrary, the insulating layer 30 disposed on the semiconductor layer 10 in the pixel area AR2 may function as an anti-reflection layer.

The insulating layer 30 may include the same material as the isolation layer 16 and the pixel isolation layer 116. In some embodiments, the insulating layer 30 may include a different material from the isolation layer 16 and the pixel isolation layer 116. For example, the insulating layer 30 may include at least one of a silicon oxide layer, a silicon nitride layer, a silicon oxynitride layer, and/or a high-k dielectric layer (e.g., a hafnium oxide layer or an aluminum oxide layer), among others.

The pad 35 may be disposed on the insulating layer 30 in the pad area AR1. The pad 35 may cover a portion of the insulating layer 30 disposed on the semiconductor layer 10 in the pad area AR1. In some embodiments, the pad 35 may be surrounded by the isolation layer 16 when viewed from a plan view. The pad 35 may be in contact with the through-via 33, and thus, the pad 35 may be electrically connected to the metal interconnection 22 through the through-via 33.

A protection layer 130 may be disposed on the semiconductor layer 10. The protection layer 130 may expose a portion of the pad 35 and may cover the rest portion of the pad 35 and the insulating layer 30. The protection layer 130 may include an insulating material (e.g., silicon nitride).

Color filters 135 may be disposed on the protection layer 130 of the pixel area AR2. The color filters 135 may face the unit pixel regions PX, respectively. In other words, each of the color filters 135 may be disposed to correspond to each of the photoelectric conversion elements PD. Micro-lenses 140 may be disposed on the color filters 135.

Figure 15:
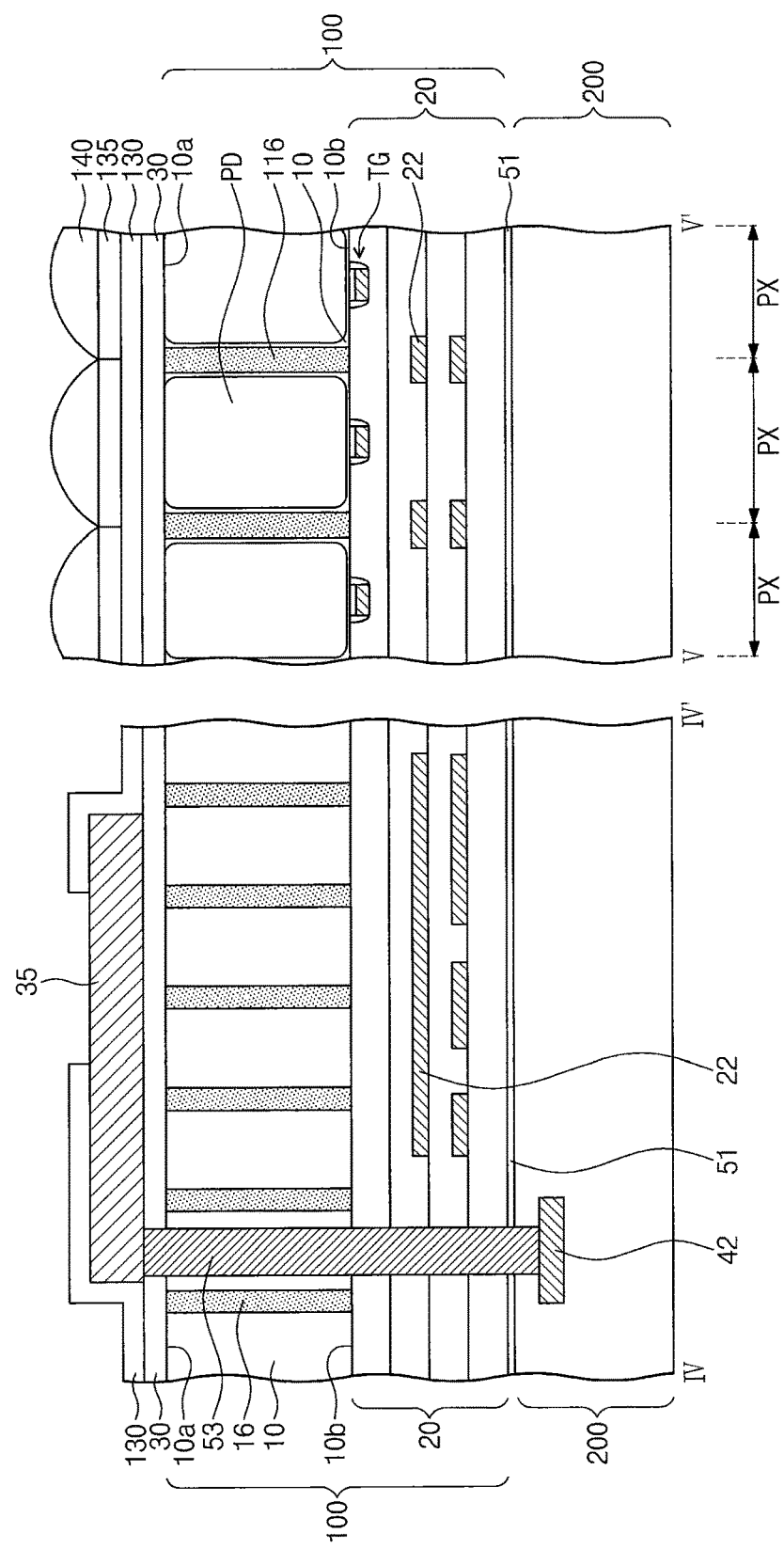
FIG. 15 is a cross-sectional view taken along the lines IV-IV' and V-V' of FIG. 13 to illustrate a semiconductor device according to some embodiments of the inventive concepts.

FIG. 15 is a cross-sectional view taken along the lines IV-IV' and V-V' of FIG. 13 to illustrate a semiconductor device according to some embodiments of the inventive concepts. In the present embodiments, the same elements as described in the embodiments of FIG. 14 will be indicated by the same reference numerals or the same reference designators, and the descriptions to the same elements as in the embodiments of FIG. 14 will be omitted or mentioned briefly for the purpose of ease and convenience in explanation.

Referring to FIG. 15, a second substrate 200 may be provided on a first substrate 100. The first substrate 100 may include a semiconductor layer 10 and an interconnection structure 20. In some embodiments, the first substrate 100 may include elements (e.g., the transfer gates TG) of the pixel circuits. In some embodiments, the first substrate 100 may include the elements (e.g., the transfer gates TG) of the pixel circuits and logic elements (e.g., a vertical driving circuit, a column signal processing circuit, a horizontal driving circuit, and/or a system control circuit) for driving the elements of the pixel circuits.

The second substrate 200 may be adhered to the first substrate 100. In some embodiments, the second substrate 200 may be adhered to the interconnection structure 20 of the first substrate 100 by an adhesive layer 51. In some embodiments, the second substrate 200 may include the logic elements (e.g., the vertical driving circuit, the column signal processing circuit, the horizontal driving circuit, and/or the system control circuit) for driving the elements (e.g., the transfer gates TG) of the pixel circuits disposed on the first substrate 100. In some embodiments, the second substrate 200 may be a dummy substrate. The second substrate 200 may include a metal interconnection 42. The metal interconnection 42 may be disposed in the second substrate 200 of the pad area AR1.

The through-via 53 may penetrate the first substrate 100 so as to be connected to the metal interconnection 42 of the second substrate 200. In some embodiments, the through-via 53 may penetrate the semiconductor layer 10, the interconnection structure 20, and the adhesive layer 51 so as to be in contact with the metal interconnection 42.

Figure 16:
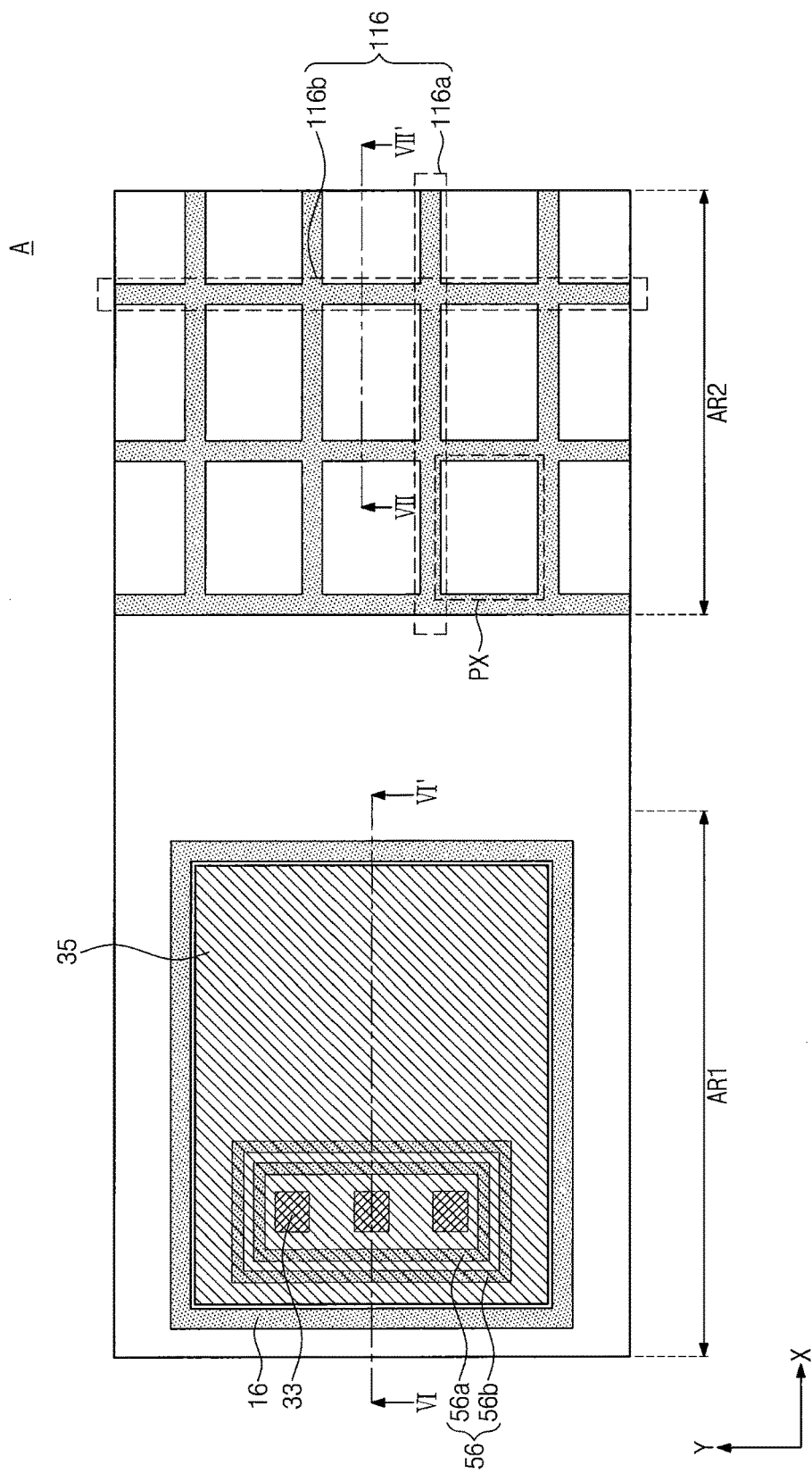
FIG. 16 is a plan view illustrating a semiconductor device according to some embodiments of the inventive concepts.
Figure 17:
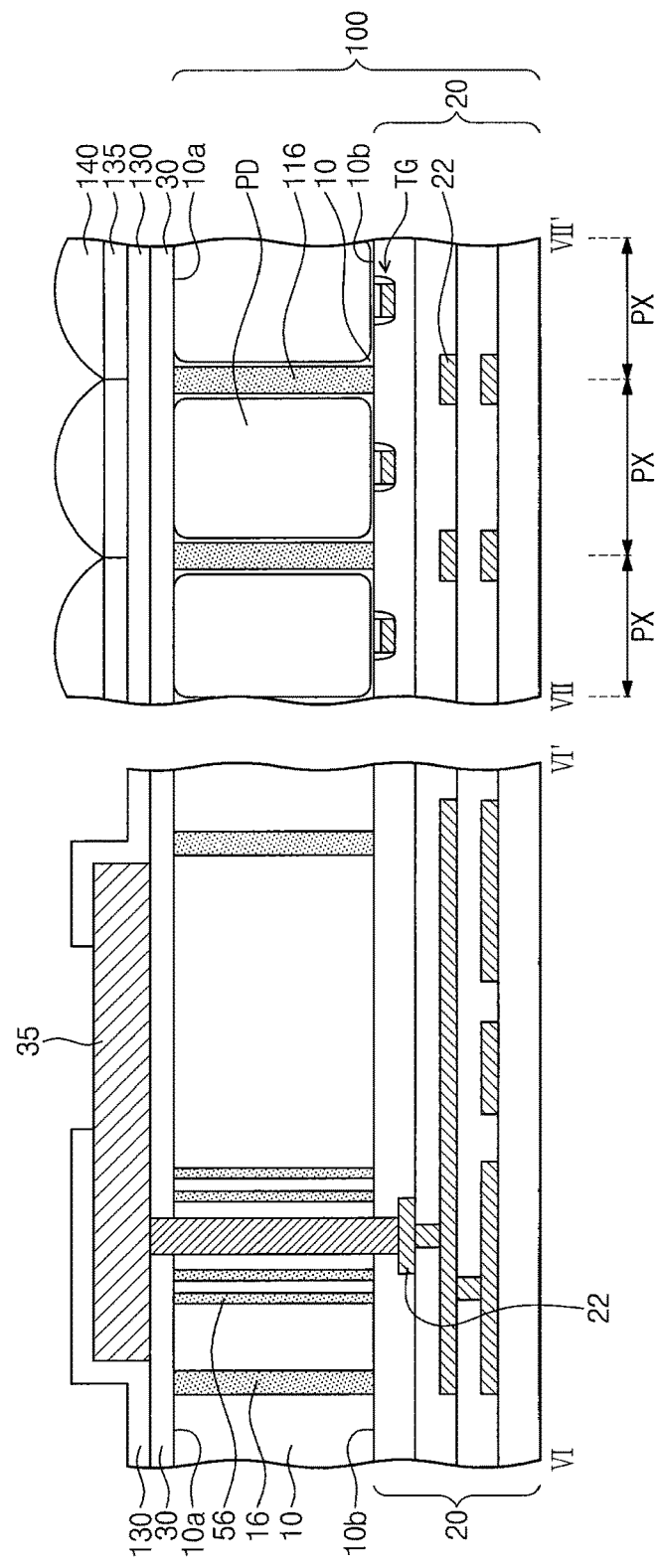
FIG. 17 is a cross-sectional view taken along lines VI-VI' and VII-VII' of FIG. 16 to illustrate a semiconductor device according to some embodiments of the inventive concepts.

FIG. 16 is a plan view illustrating a semiconductor device according to some embodiments of the inventive concepts. FIG. 17 is a cross-sectional view taken along lines VI-VI' and VII-VII' of FIG. 16 to illustrate a semiconductor device according to some embodiments of the inventive concepts. In the present embodiments, the same elements as described in the embodiments of FIGS. 13 and 14 will be indicated by the same reference numerals or the same reference designators, and the descriptions to the same elements as in the embodiments of FIGS. 13 and 14 will be omitted or mentioned briefly for the purpose of ease and convenience in explanation.

Referring to FIGS. 16 and 17, an isolation layer 16 of FIGS. 16 and 17 may have a different structure from the isolation layer 16 illustrated in FIGS. 13 to 14. In some embodiments, the isolation layer 16 according to the present embodiments may have a loop shape surrounding each of the pads 35 when viewed from a plan view. A via isolation layer 56 may penetrate the semiconductor layer 10 and may surround the through-via 33. The via isolation layer 56 may include a first via isolation layer 56a and a second via isolation layer 56b. The first via isolation layer 56a may surround the through-via 33, and the second via isolation layer 56b may surround the first via isolation layer 56a. The second via isolation layer 56b may be disposed between the first via isolation layer 56a and the isolation layer 16. The via isolation layer 56 may include one or more layers. For example, the via isolation layer 56 may include at least one of a silicon oxide layer, a silicon nitride layer, a silicon oxynitride layer, or a poly-silicon layer.

FIGS. 18A to 18G are cross-sectional views taken along the lines IV-IV' and V-V' of FIG. 13 to illustrate methods of manufacturing a semiconductor device according to some embodiments of the inventive concepts. In the present embodiments, the same elements as described in the embodiments of FIGS. 9A to 9D will be indicated by the same reference numerals or the same reference designators, and the descriptions to the same elements as in the embodiments of FIGS. 9A to 9D will be omitted or mentioned briefly for the purpose of ease and convenience in explanation.

Figure 18A:
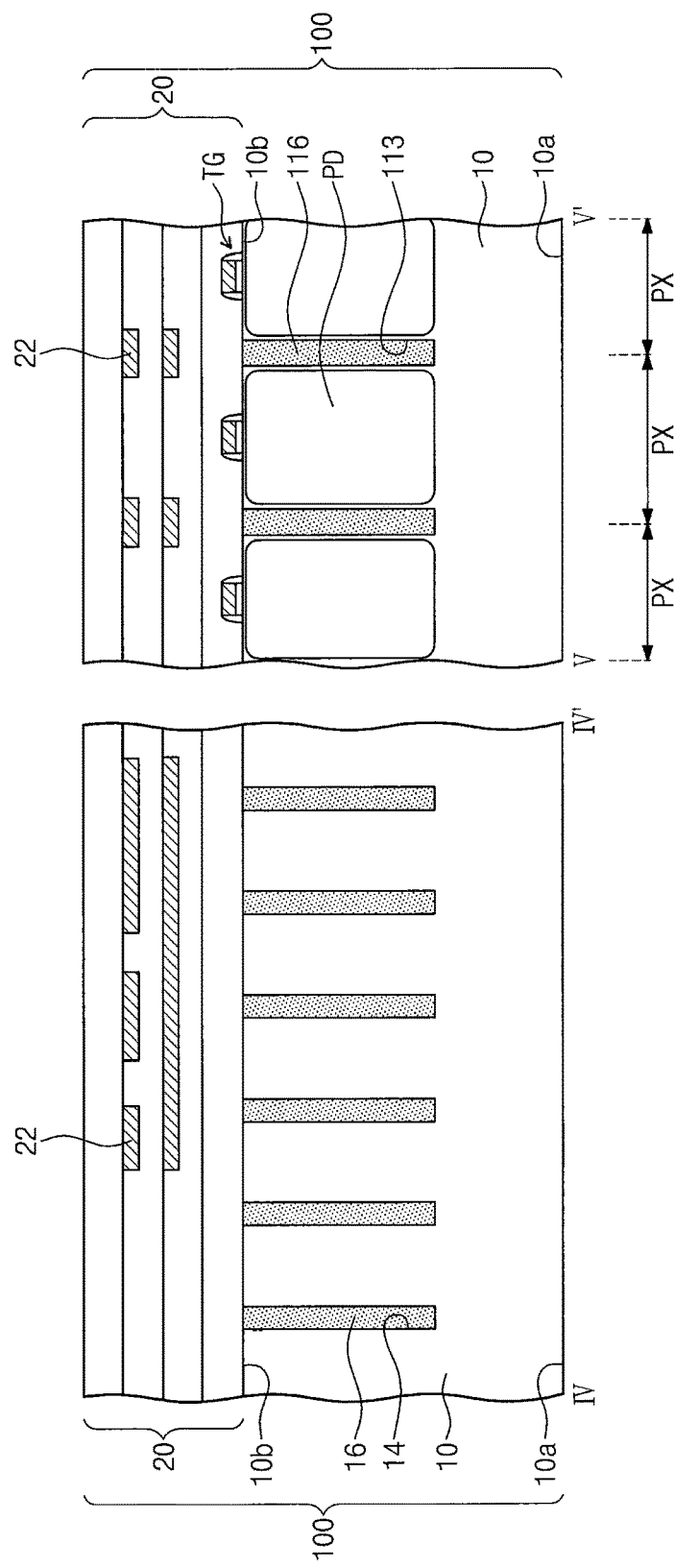
FIGS. 18A to 18G are cross-sectional views taken along the lines IV-IV' and V-V' of FIG. 13 to illustrate methods of manufacturing a semiconductor device according to some embodiments of the inventive concepts.

Referring to FIG. 18A, a semiconductor layer 10 may be provided. The semiconductor layer 10 may include a first surface 10a and a second surface 10b.

Photoelectric conversion elements PD may be formed in the semiconductor layer 10. The photoelectric conversion elements PD may be formed by performing an ion implantation process on the second surface 10b of the semiconductor layer 10. The photoelectric conversion elements PD may be doped with, for example, N-type dopants.

An isolation layer 16 may be formed in the semiconductor layer 10 of the pad area AR1. A portion of the semiconductor layer 10 of the pad area AR1 may be selectively etched from the second surface 10b to form an isolation trench 14 in the semiconductor layer 10, and the isolation trench 14 may be filled with an insulating material, thereby forming the isolation layer 16. As illustrated in FIG. 13, the isolation layer 16 may include the first isolation layers 16a extending in the first direction X and the second isolation layers 16b extending in the second direction Y to intersect the first isolation layers 16a. The isolation layer 16 may have a grid structure when viewed from a plan view. The isolation layer 16 may define a plurality of unit regions UR in the semiconductor layer 10 of the pad area AR1.

A pixel isolation layer 116 may be formed in the semiconductor layer 10 of the pixel area AR2. A portion of the semiconductor layer 10 of the pixel area AR2 may be selectively etched from the second surface 10b to form a pixel trench 113 in the semiconductor layer 10, and the pixel trench 113 may be filled with an insulating material, thereby forming the pixel isolation layer 116. For example, the pixel isolation layer 116 may include at least one of a silicon oxide layer, a silicon nitride layer, a silicon oxynitride layer, and/or a poly-silicon layer, among others. As illustrated in FIG. 13, the pixel isolation layer 116 may include the first pixel isolation layers 116a extending in the first direction X and the second pixel isolation layers 116b extending in the second direction Y to intersect the first pixel isolation layers 116a.

The pixel isolation layer 116 may be formed simultaneously with the isolation layer 16 or may be formed by an additional process. The pixel isolation layer 116 may have a grid structure when viewed from a plan view. The pixel isolation layer 116 may define a plurality of unit pixel regions PX in the semiconductor layer 10 of the pixel area AR2. The pixel isolation layer 116 may physically separate the photoelectric conversion elements PD from each other.

Transfer gates TG may be formed on the second surface 10b of the semiconductor layer 10. The transfer gates TG may be disposed on the second surface 10b of the semiconductor layer 10 to correspond to the unit pixel regions PX, respectively.

An interconnection structure 20 may be formed on the second surface 10b of the semiconductor layer 10. The interconnection structure 20 may be formed by stacking a plurality of insulating layers and a plurality of metal interconnections 22. At least one of the insulating layers of the interconnection structure 20 may cover the transfer gates TG.

Figure 18B:
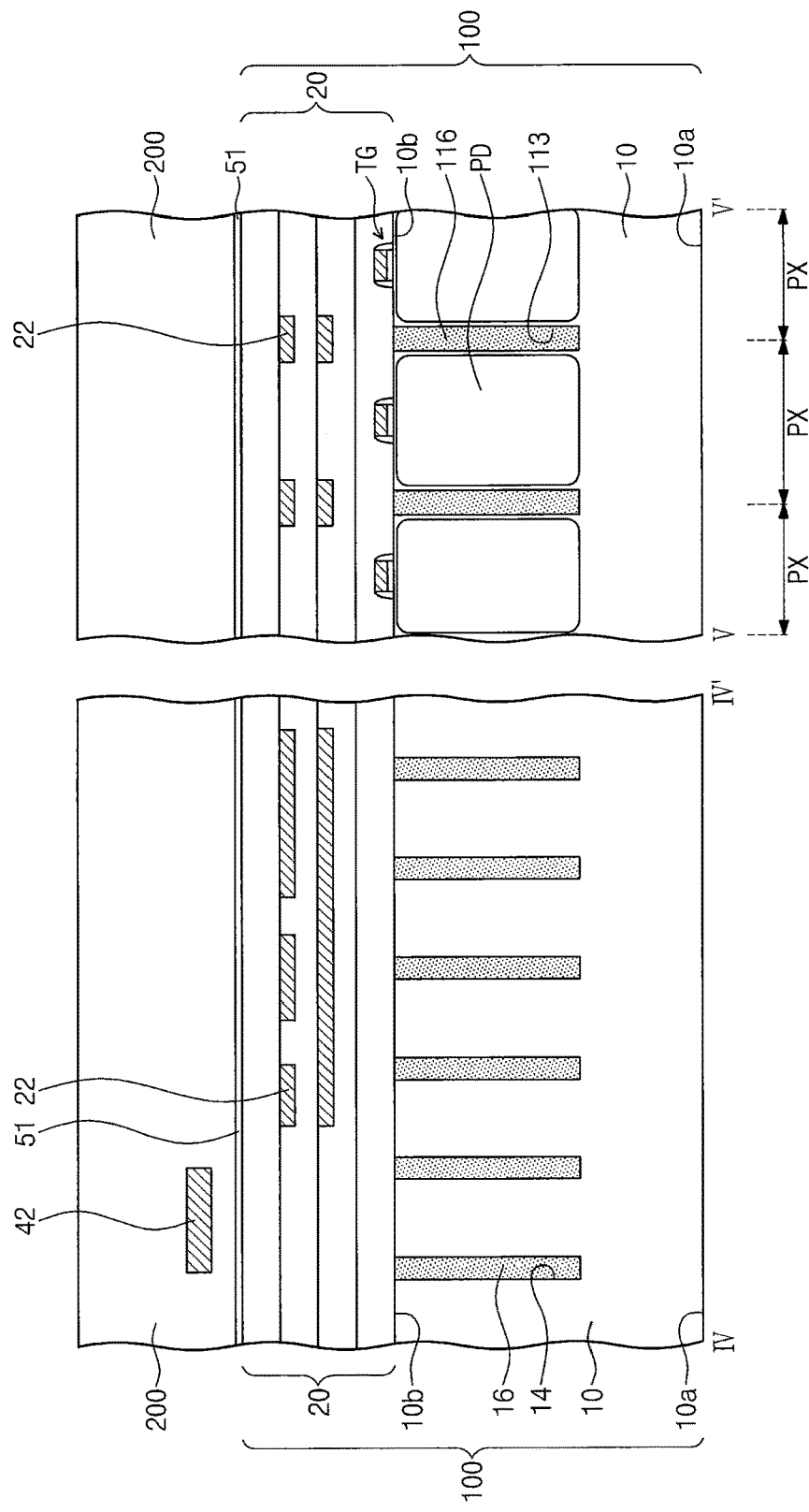

Referring to FIG. 18B, the semiconductor layer 10 and the interconnection structure 20 may constitute a first substrate 100. A second substrate 200 may be stacked on the interconnection structure 20. The second substrate 200 may be adhered to the interconnection structure 20 by means of an adhesive layer 51. The second substrate 200 may include a metal interconnection 42. The metal interconnection 42 may vertically overlap with the semiconductor layer 10 of the pad area AR1.

Figure 18C:
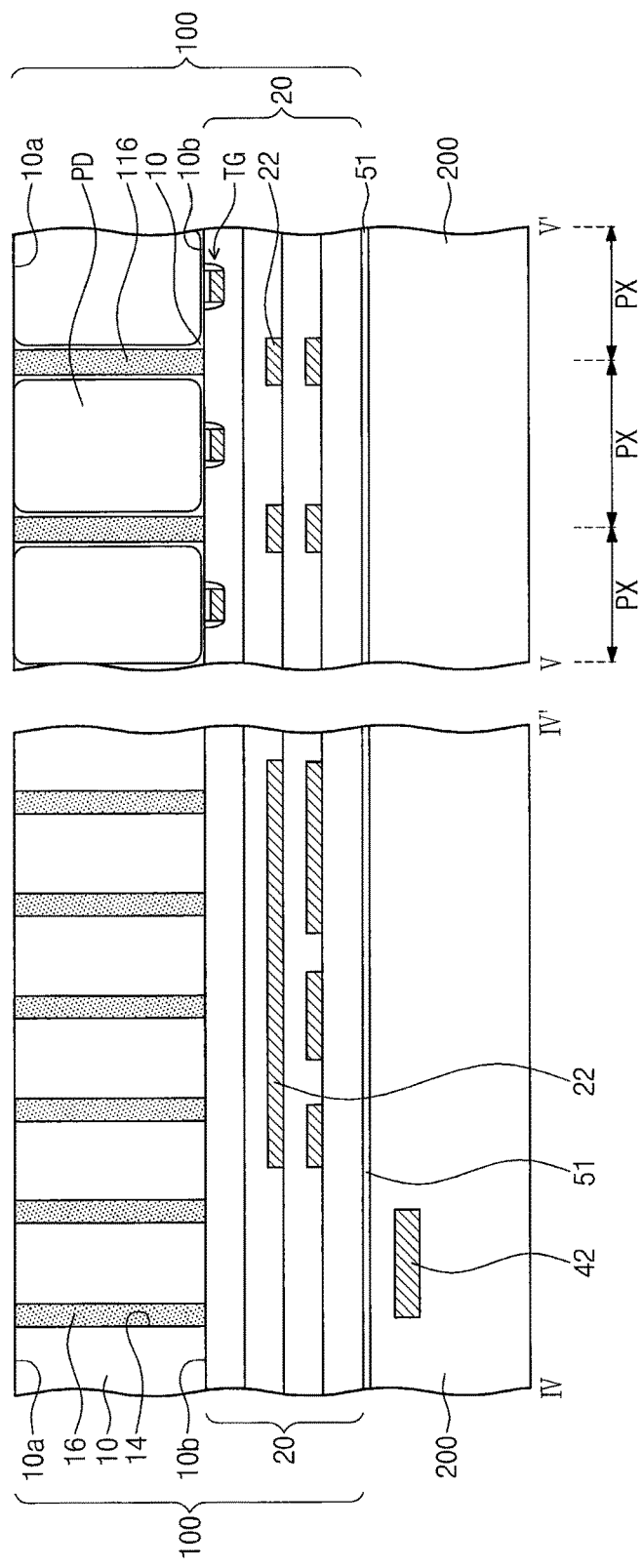

Referring to FIG. 18C, the first surface 10a of the semiconductor layer 10 may be etched until the isolation layer 16 and the pixel isolation layer 116 are exposed. The etching process may include a CMP process and/or an etch-back process.

Figure 18D:
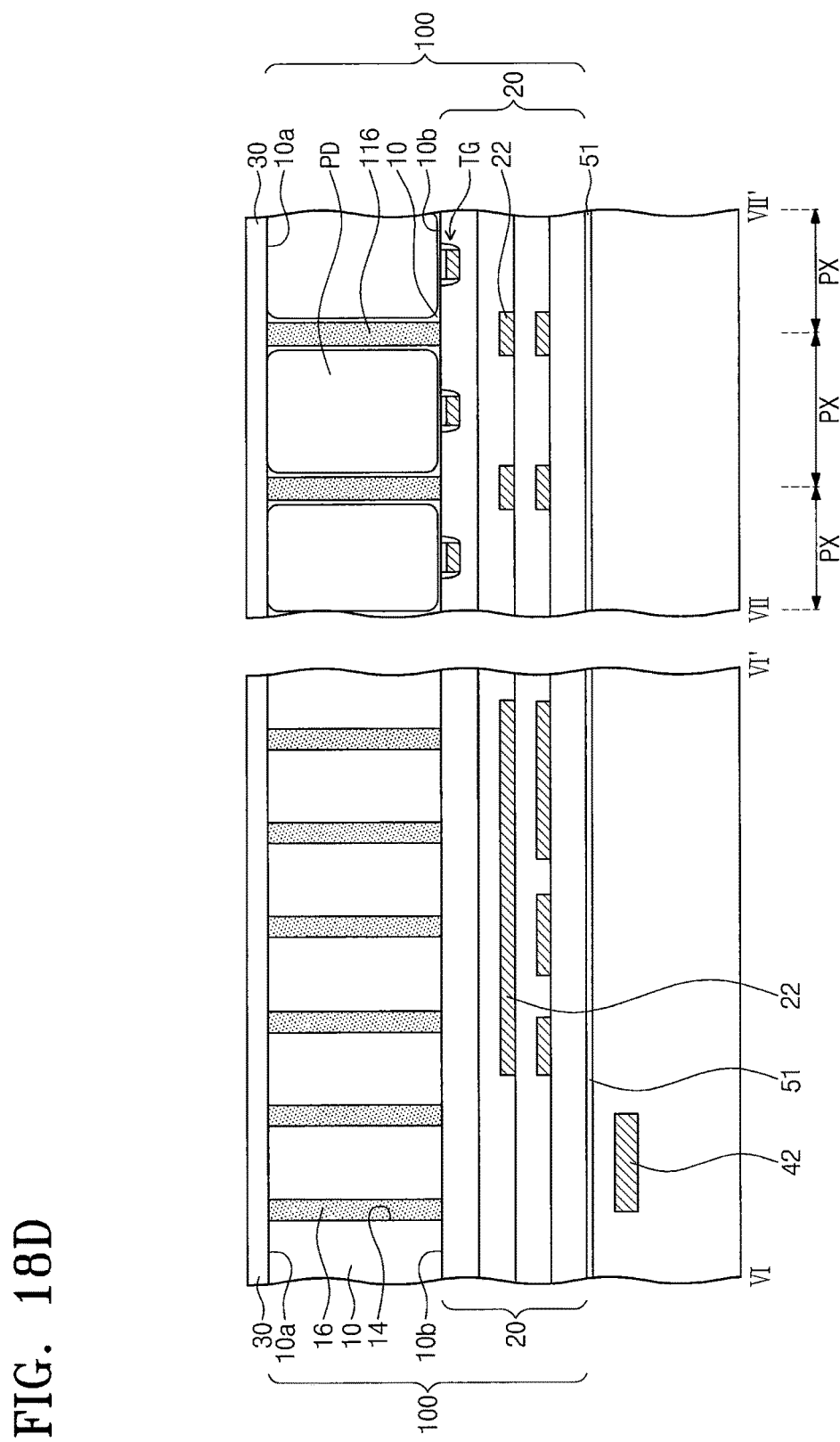

Referring to FIG. 18D, an insulating layer 30 may be formed on the first surface 10a of the semiconductor layer 10. The insulating layer 30 may cover an entire portion of the first surface 10a of the semiconductor layer 10. The insulating layer 30 may cover a top surface of the isolation layer 16, a top surface of the pixel isolation layer 116, and the photoelectric conversion elements PD. For example, the insulating layer 30 may include at least one of a silicon oxide layer, a silicon nitride layer, a silicon oxynitride layer, and/or a high-k dielectric layer (e.g., a hafnium oxide layer or an aluminum oxide layer), among others.

Figure 18E:
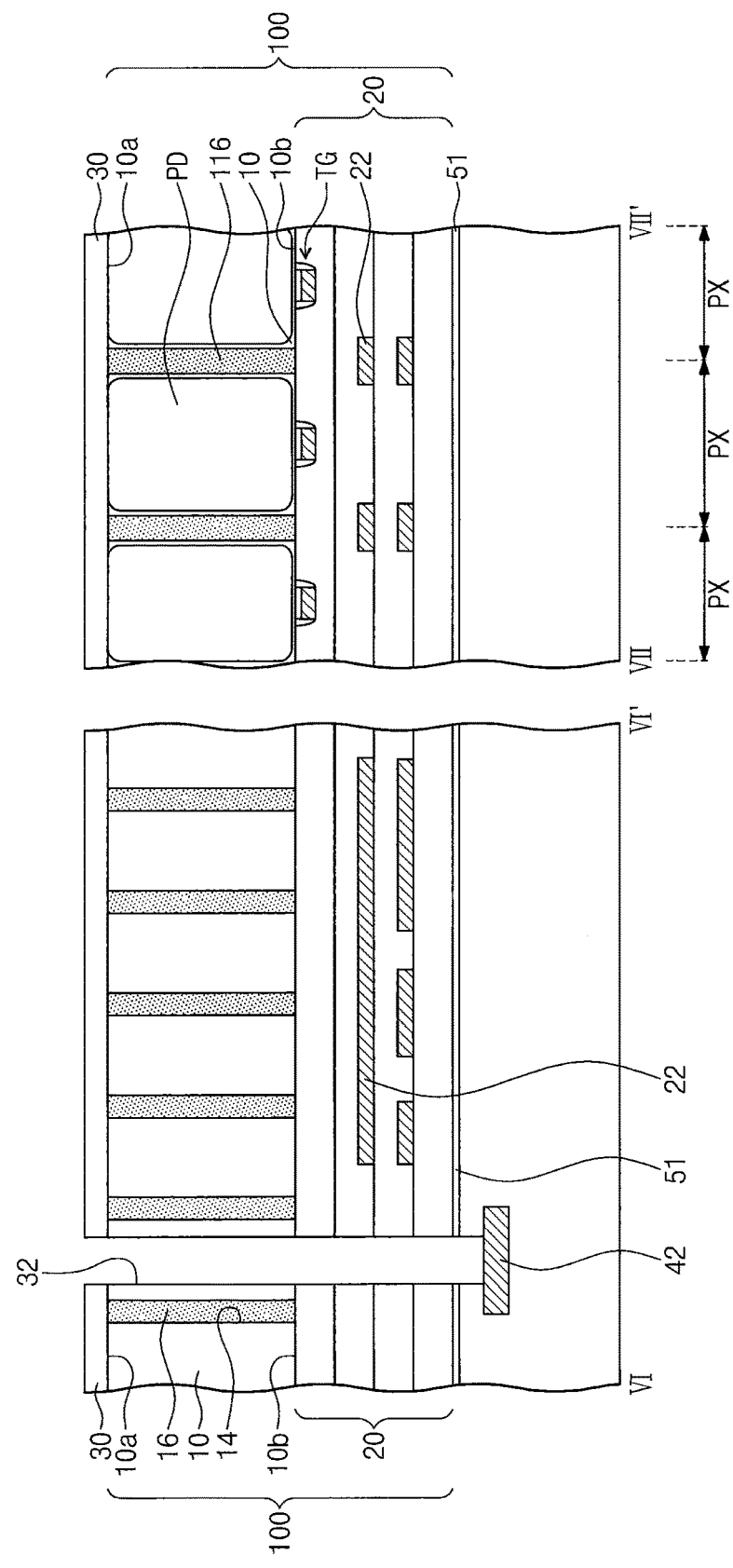

Referring to FIG. 18E, a via-hole 32 may be formed in the semiconductor layer 10. In detail, the via-hole 32 may be formed in the semiconductor layer 10 of the pad area AR1. A portion of the interconnection structure 20 and a portion of an upper portion of the second substrate 200 may be further etched to expose the metal interconnection 42. As a result, the metal interconnection 42 of the second substrate 200 may be exposed through the via-hole 32.

Figure 18F:
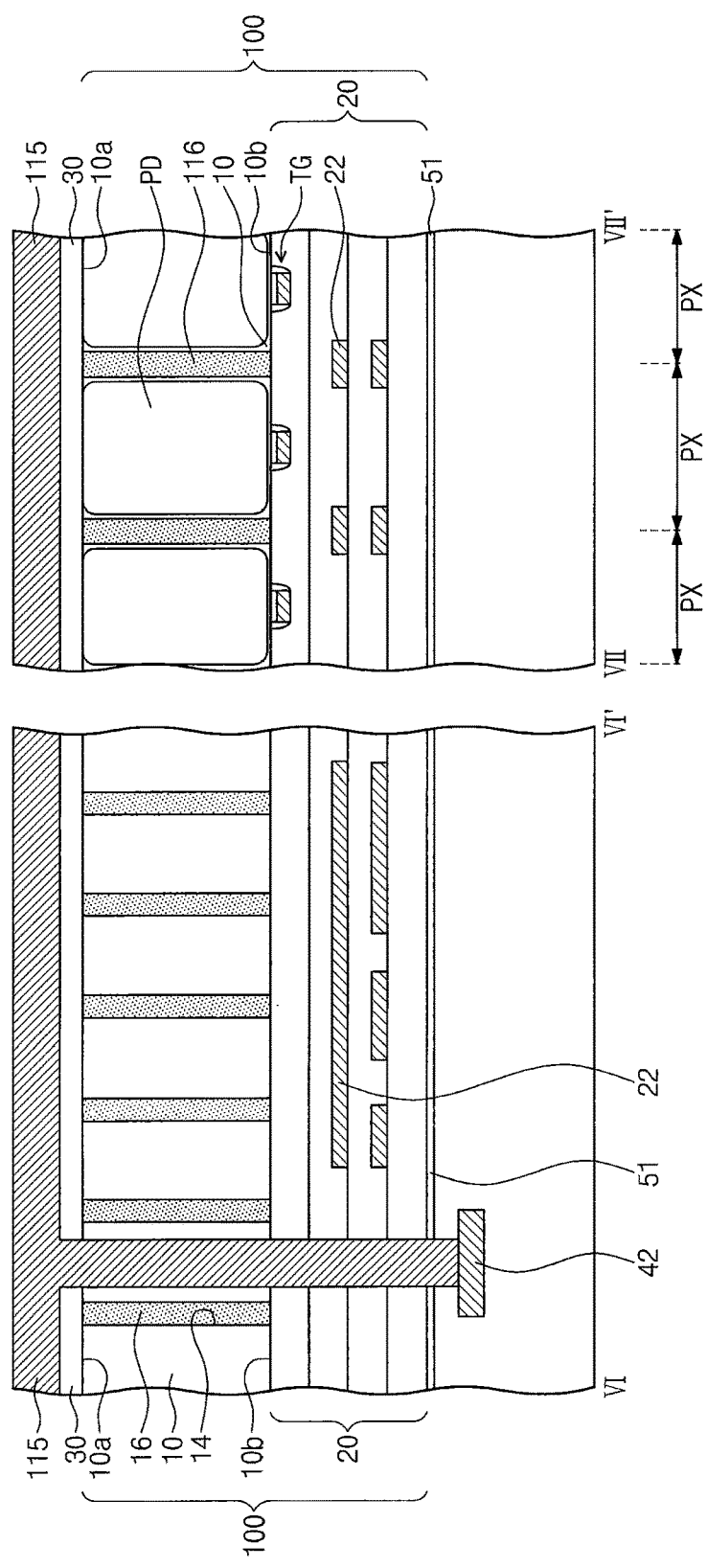

Referring to FIG. 18F, a conductive layer 115 may be formed to fill the via-hole 32 and to cover the insulating layer 30. The conductive layer 115 may cover the insulating layer 30 of the pad area AR1 and the insulating layer 30 of the pixel area AR2. For example, the conductive layer 115 may include at least one of copper (Cu), aluminum (Al), gold (Au), titanium (Ti), tantalum (Ta), and/or tungsten (W), among others.

Figure 18G:
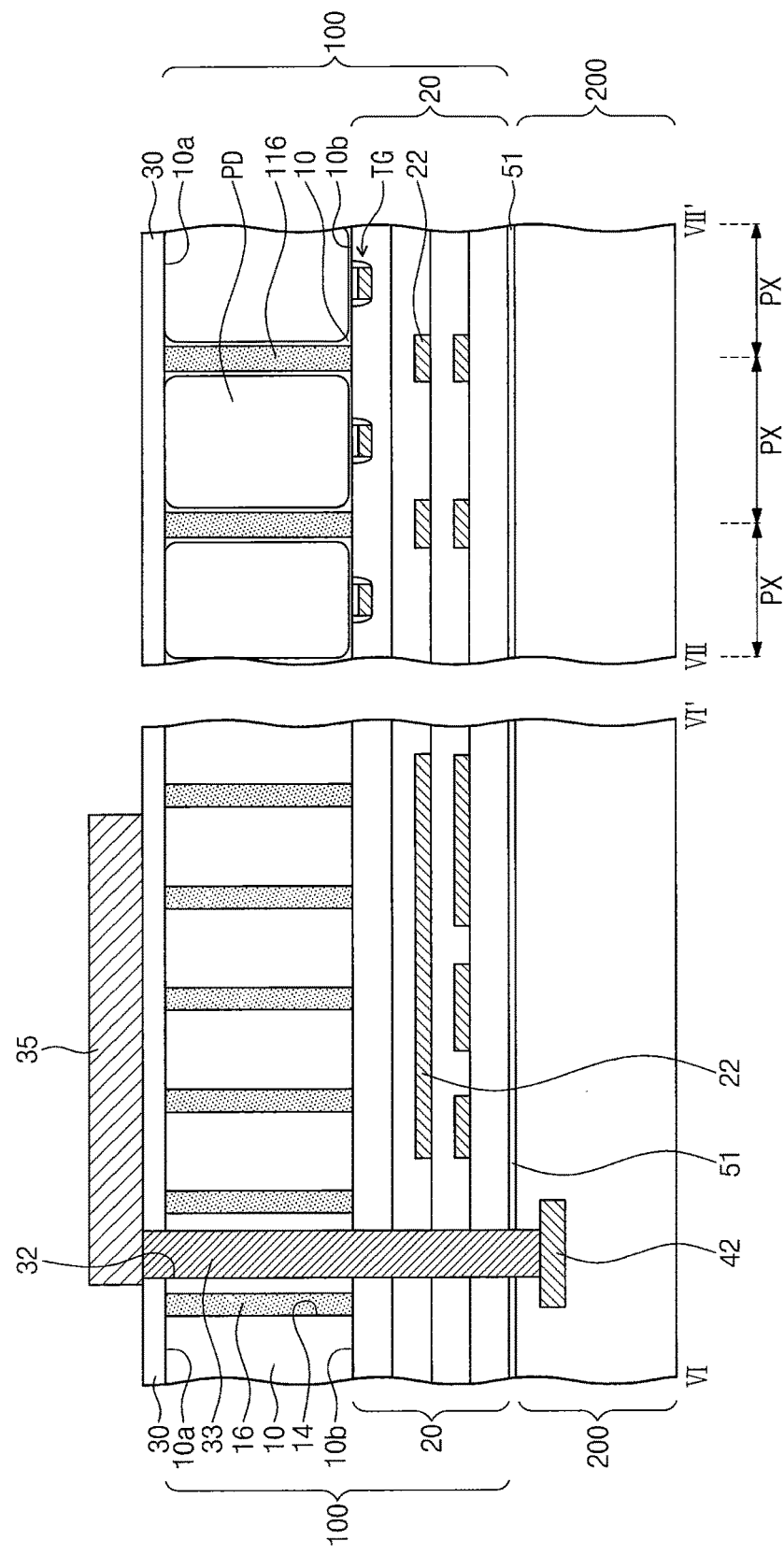

Referring to FIG. 18G, a polishing process may be performed on the conductive layer 115 to form a through-via 33 in the via-hole 32. A pad 35 may be formed on the through-via 33. The pad 35 may be formed on the first substrate 100 of the pad area AR1. For example, the pad 35 may include at least one of copper (Cu), aluminum (Al), gold (Au), titanium (Ti), tantalum (Ta), and/or tungsten (W), among others.

Referring again to FIG. 15, a protection layer 130 may be formed on the first substrate 100 of the pad area AR1 and the pixel area AR2 and may expose a portion of the pad 35. The protection layer 130 may cover the insulating layer 30 of the pixel area AR2, the insulating layer 30 of the pad area AR1, and another portion of the pad 35. For example, the protection layer 130 may include at least one of a silicon oxide layer, a silicon nitride layer, and/or a silicon oxynitride layer, among others.

Color filters 135 may be formed on the first substrate 100 of the pixel area AR2. The color filters 135 may be formed on the unit pixel regions PX, respectively. Micro-lenses 140 may be formed on the color filters 135, respectively.

The semiconductor device according to embodiments of the inventive concepts may include the isolation layer penetrating the semiconductor layer and surrounding the pad disposed on the semiconductor layer in a plan view. Thus, even though the insulating layer between the semiconductor layer and the pad is damaged to generate a leakage current between the pad and the semiconductor layer, the isolation layer may prevent the leakage current from flowing to a neighboring pad through the semiconductor layer. As a result, a yield and reliability of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a pad on a semiconductor layer;
   an insulating layer that is between the semiconductor layer and the pad;
   a through-via that penetrates the semiconductor layer and the insulating layer and that is connected to the pad; and
   an isolation layer that penetrates the semiconductor layer and that surrounds the pad when viewed from a plan view,
   wherein the isolation layer comprises:
   first isolation layers that extend in a first direction and that are arranged in a second direction intersecting the first direction, wherein the first isolation layers are spaced apart from each other in the second direction; and
   second isolation layers that extend in the second direction and that intersect the first isolation layers, wherein the second isolation layers are spaced apart from each other in the first direction, wherein the isolation layer has a grid structure when viewed from a plan view.

2. The semiconductor device of claim 1, wherein the semiconductor layer comprises unit regions that are defined by the isolation layer, and
   wherein the unit regions are arranged in a matrix form.

3. The semiconductor device of claim 2, wherein the unit regions include first unit regions and second unit regions,
   wherein the through-via is in each of the first unit regions of the semiconductor layer but is not in the second unit regions of the semiconductor layer, and
   wherein a quantity of the first unit regions is smaller than a quantity of the second unit regions.

4. The semiconductor device of claim 3, wherein one or more through-vias are in one of the first unit regions.

5. The semiconductor device of claim 3, wherein one through-via is in each of the first unit regions.

6. The semiconductor device of claim 1, wherein the semiconductor layer comprises a pixel area and a pad area that is around the pixel area,
   wherein the pad comprises a plurality of pads that are on a first surface of the semiconductor layer of the pad area, and
   wherein the plurality of pads are arranged to surround the pixel area when viewed from a plan view.

7. The semiconductor device of claim 6, further comprising:
   an interconnection structure that is on a second surface of the semiconductor layer that is opposite the first surface of the semiconductor layer,
   wherein the interconnection structure comprises a metal interconnection, and
   wherein the through-via contacts the metal interconnection.

8. The semiconductor device of claim 1, wherein the semiconductor layer comprises a unit region that is defined by the isolation layer,
   wherein the pad comprises:
   a first portion that overlaps the unit region of the semiconductor layer; and
   a second portion that does not overlap the unit region of the semiconductor layer,
   wherein the second portion of the pad surrounds the first portion of the pad when viewed from a plan view.

9. The semiconductor device of claim 1, wherein the semiconductor layer comprises:
   a first portion, wherein the pad is on the first portion; and
   a second portion that is around the first portion,
   wherein the first portion of the semiconductor layer has an island shape that is separated from the second portion of the semiconductor layer by the isolation layer.

10. A semiconductor device comprising:
    a semiconductor layer that comprises a pixel area and a pad area that is around the pixel area;
    a pixel isolation layer that penetrates the semiconductor layer of the pixel area to define unit pixel regions;
    a plurality of photoelectric conversion elements that are in the unit pixel regions;
    a plurality of through-vias that penetrate the semiconductor layer of the pad area;
    a plurality of pads that are on the semiconductor layer of the pad area and that are in contact with ones of the plurality of through-vias; and
    a pad isolation layer that penetrates the semiconductor layer of the pad area to surround each of the pads when viewed from a plan view.

11. The semiconductor device of claim 10, wherein the pad isolation layer comprises:
    first isolation layers that extend in one direction and that are arranged in parallel with one another; and
    second isolation layers that intersect the first isolation layers,
    wherein the pad isolation layer has a grid structure when viewed from a plan view.

12. The semiconductor device of claim 11, wherein the semiconductor layer of the pad area includes unit regions that are defined by the pad isolation layer,
    wherein the unit regions of the pad area are arranged in a matrix form, and
    wherein the unit pixel regions of the pixel area are arranged in a matrix form.

13. The semiconductor device of claim 10, further comprising:
    a via isolation layer that penetrates the semiconductor layer of the pad area and that surrounds the through-via connected to each of the pads,
    wherein the via isolation layer is between the through-via and the pad isolation layer.

14. A semiconductor device comprising:
    a pixel isolation layer that penetrates a pixel area of a semiconductor layer and that is between a plurality of unit pixel regions in the pixel area;
    a plurality of through-vias that penetrate a pad area of the semiconductor layer that is different from the pixel area;
    a plurality of pads that are in contact with ones of the plurality of through-vias; and
    a pad isolation layer that penetrates the semiconductor layer of the pad area and that surrounds ones of the plurality of pads when viewed from a plan view.

15. The semiconductor device of claim 14, further comprising a plurality of photoelectric conversion elements that are in the unit pixel regions.

16. The semiconductor device of claim 14, wherein the pad area is around the pixel area,
    wherein the plurality of pads are on a first surface of the semiconductor layer of the pad area and are arranged to surround the pixel area when viewed from a plan view, the device further comprising:
    an interconnection structure that is on a second surface of the semiconductor layer that is opposite the first surface of the semiconductor layer and that comprises a metal interconnection that contacts ones of the plurality of through-vias.

17. The semiconductor device of claim 14, wherein the pad isolation layer comprises:
- first isolation layers that extend in a first direction and that are arranged in parallel with one another; and
- second isolation layers that are extend in a second direction that is different from the first direction and that intersect the first isolation layers.

18. The semiconductor device of claim 14, further comprising an insulating layer that is between the semiconductor layer and the plurality of pads.

* * * * *